US012635510B2

(12) United States Patent (10) Patent No.: US 12,635,510 B2
Uzoh et al. (45) Date of Patent: May 19, 2026

(54) INTERCONNECT STRUCTURES AND METHODS FOR FORMING SAME

(71) Applicant: Adeia Semiconductor Technologies LLC, San Jose, CA (US)

(72) Inventors: Cyprian Emeka Uzoh, San Jose, CA (US); Laura Wills Mirkarimi, Sunol, CA (US)

(73) Assignee: Adeia Semiconductor Technologies LLC, San Jose, CA (US)

( * ) Notice: Subject to any disclaimer, the term of this patent is extended or adjusted under 35 U.S.C. 154(b) by 0 days.

(21) Appl. No.: 17/517,247

(22) Filed: Nov. 2, 2021

(65) Prior Publication Data

US 2022/0130714 A1 Apr. 28, 2022

Related U.S. Application Data

(63) Continuation of application No. 16/140,995, filed on Sep. 25, 2018, now Pat. No. 11,195,748.

(Continued)

(51) Int. Cl.
H01L 21/768 (2006.01)
H10W 20/00 (2026.01)
(Continued)

(52) U.S. Cl.
CPC ......... H10W 20/46 (2026.01); H10W 20/033 (2026.01); H10W 20/048 (2026.01);
(Continued)

(58) Field of Classification Search
CPC ........... H01L 21/7682; H01L 21/76843; H01L 21/76856; H01L 23/5226; H01L 23/53233; H01L 23/53238; H01L 23/5329; H01L 24/03; H01L 24/04; H01L 24/05; H01L 24/24; H01L 24/80; H01L 24/82
See application file for complete search history.

(56) References Cited

U.S. PATENT DOCUMENTS 5,753,536 A 5/1998 Sugiyama et al.
5,771,555 A 6/1998 Eda et al.
(Continued)

FOREIGN PATENT DOCUMENTS

CN 102222641 A 10/2011
JP 2013-033786 A 2/2013
(Continued)

OTHER PUBLICATIONS

International Search Report and Written Opinion mailed Jan. 18, 2019 in International Application No. PCT/US2018/052904, 15 pages.

(Continued)

*Primary Examiner* — Victor A Mandala
*Assistant Examiner* — Colleen E Snow
(74) *Attorney, Agent, or Firm* — HG LAW LLP

(57) ABSTRACT

A method for forming an interconnect structure in an element is disclosed. The method can include patterning a cavity in a non-conductive material. The method can include exposing a surface of the cavity in the non-conductive material to a surface nitriding treatment. The method can include depositing a conductive material directly onto the treated surface after the exposing.

21 Claims, 9 Drawing Sheets

Related U.S. Application Data

(60) Provisional application No. 62/564,068, filed on Sep. 27, 2017.

(51) Int. Cl.

| | |
|---|---|
| *H10W 20/41* | (2026.01) |
| *H10W 20/42* | (2026.01) |
| *H10W 20/44* | (2026.01) |
| *H10W 20/46* | (2026.01) |
| *H10W 20/48* | (2026.01) |
| *H10W 70/05* | (2026.01) |
| *H10W 70/60* | (2026.01) |
| *H10W 72/00* | (2026.01) |
| *H10W 72/90* | (2026.01) |
| *H10W 72/30* | (2026.01) |
| *H10W 80/00* | (2026.01) |
| *H10W 90/00* | (2026.01) |

(52) U.S. Cl.

CPC ......... *H10W 20/072* (2026.01); *H10W 20/42* (2026.01); *H10W 20/425* (2026.01); *H10W 20/4424* (2026.01); *H10W 20/48* (2026.01); *H10W 70/093* (2026.01); *H10W 70/60* (2026.01); *H10W 72/019* (2026.01); *H10W 72/90* (2026.01); *H10W 72/352* (2026.01); *H10W 80/016* (2026.01); *H10W 80/102* (2026.01); *H10W 80/312* (2026.01); *H10W 80/327* (2026.01); *H10W 90/722* (2026.01); *H10W 90/732* (2026.01); *H10W 90/734* (2026.01); *H10W 90/792* (2026.01); *H10W 90/794* (2026.01)

(56) References Cited

U.S. PATENT DOCUMENTS

| | | | |
|---|---|---|---|
| 5,818,071 A | 10/1998 | Loboda et al. | |
| 5,821,168 A | 10/1998 | Jain | |
| 6,037,258 A | 3/2000 | Liu et al. | |
| 6,066,892 A | 5/2000 | Ding et al. | |
| 6,080,640 A | 6/2000 | Gardner et al. | |
| 6,084,302 A | 7/2000 | Sandhu | |
| 6,106,653 A | 8/2000 | Polizzotti et al. | |
| 6,181,012 B1 | 1/2001 | Edelstein et al. | |
| 6,187,670 B1 | 2/2001 | Brown et al. | |
| 6,225,221 B1 | 5/2001 | Ho et al. | |
| 6,255,217 B1 | 7/2001 | Agnello et al. | |
| 6,277,249 B1 | 8/2001 | Gopalraja et al. | |
| 6,277,720 B1 | 8/2001 | Doshi et al. | |
| 6,281,121 B1 | 8/2001 | Brown et al. | |
| 6,391,776 B1 | 5/2002 | Hashim et al. | |
| 6,399,496 B1 | 6/2002 | Edelstein et al. | |
| 6,423,640 B1 | 7/2002 | Lee et al. | |
| 6,441,492 B1 | 8/2002 | Cunningham | |
| 6,444,568 B1 | 9/2002 | Sundararajan et al. | |
| 6,465,892 B1 | 10/2002 | Suga | |
| 6,518,668 B2 | 2/2003 | Cohen | |
| 6,593,660 B2 | 7/2003 | Buchwalter et al. | |
| 6,600,229 B2 | 7/2003 | Mukherjee et al. | |
| 6,656,837 B2 | 12/2003 | Xu et al. | |
| 6,723,631 B2 | 4/2004 | Noguchi et al. | |
| 6,734,071 B1 | 5/2004 | Honeycutt et al. | |
| 6,821,571 B2 | 11/2004 | Huang | |
| 6,887,769 B2 | 5/2005 | Kellar et al. | |
| 6,908,027 B2 | 6/2005 | Tolchinsky et al. | |
| 7,045,453 B2 | 5/2006 | Canaperi et al. | |
| 7,105,434 B2 | 9/2006 | Cohen | |
| 7,105,980 B2 | 9/2006 | Abbott et al. | |
| 7,193,423 B1 | 3/2007 | Dalton et al. | |
| 7,226,876 B2 | 6/2007 | Schmitt et al. | |
| 7,351,655 B2 | 4/2008 | Cunningham | |
| 7,476,971 B2 | 1/2009 | Iijima | |
| 7,750,488 B2 | 7/2010 | Patti et al. | |
| 7,803,693 B2 | 9/2010 | Trezza | |
| 7,951,708 B2 | 5/2011 | DeHaven et al. | |
| 8,183,127 B2 | 5/2012 | Patti et al. | |
| 8,336,204 B2 | 12/2012 | Yang et al. | |
| 8,349,635 B1 | 1/2013 | Gan et al. | |
| 8,377,798 B2 | 2/2013 | Peng et al. | |
| 8,441,131 B2 | 5/2013 | Ryan | |
| 8,476,165 B2 | 7/2013 | Trickett et al. | |
| 8,482,132 B2 | 7/2013 | Yang et al. | |
| 8,501,537 B2 | 8/2013 | Sadaka et al. | |
| 8,524,533 B2 | 9/2013 | Tong et al. | |
| 8,620,164 B2 | 12/2013 | Heck et al. | |
| 8,647,987 B2 | 2/2014 | Yang et al. | |
| 8,697,493 B2 | 4/2014 | Sadaka | |
| 8,716,105 B2 | 5/2014 | Sadaka et al. | |
| 8,802,538 B1 | 8/2014 | Liu | |
| 8,809,123 B2 | 8/2014 | Liu et al. | |
| 8,841,002 B2 | 9/2014 | Tong | |
| 9,093,350 B2 | 7/2015 | Endo et al. | |
| 9,112,004 B2 | 8/2015 | Kao et al. | |
| 9,142,517 B2 | 9/2015 | Liu et al. | |
| 9,171,756 B2 | 10/2015 | Enquist et al. | |
| 9,184,125 B2 | 11/2015 | Enquist et al. | |
| 9,224,704 B2 | 12/2015 | Landru | |
| 9,230,941 B2 | 1/2016 | Chen et al. | |
| 9,257,399 B2 | 2/2016 | Kuang et al. | |
| 9,297,775 B2 | 3/2016 | Adhiprakasha et al. | |
| 9,299,736 B2 | 3/2016 | Chen et al. | |
| 9,312,229 B2 | 4/2016 | Chen et al. | |
| 9,331,149 B2 | 5/2016 | Tong et al. | |
| 9,337,235 B2 | 5/2016 | Chen et al. | |
| 9,385,024 B2 | 7/2016 | Tong et al. | |
| 9,394,161 B2 | 7/2016 | Cheng et al. | |
| 9,431,368 B2 | 8/2016 | Enquist et al. | |
| 9,437,572 B2 | 9/2016 | Chen et al. | |
| 9,443,796 B2 | 9/2016 | Chou et al. | |
| 9,461,007 B2 | 10/2016 | Chun et al. | |
| 9,496,239 B1 | 11/2016 | Edelstein et al. | |
| 9,536,848 B2 | 1/2017 | England et al. | |
| 9,559,081 B1 | 1/2017 | Lai et al. | |
| 9,620,479 B1 | 4/2017 | Edelstein et al. | |
| 9,620,481 B2 | 4/2017 | Edelstein et al. | |
| 9,656,852 B2 | 5/2017 | Cheng et al. | |
| 9,723,716 B2 | 8/2017 | Meinhold | |
| 9,728,521 B2 | 8/2017 | Tsai et al. | |
| 9,741,620 B2 | 8/2017 | Uzoh et al. | |
| 9,786,603 B1 * | 10/2017 | Clevenger ........... H01L 23/5283 |
| 9,799,587 B2 | 10/2017 | Fujii et al. | |
| 9,852,988 B2 | 12/2017 | Enquist et al. | |
| 9,893,004 B2 | 2/2018 | Yazdani | |
| 9,929,050 B2 | 3/2018 | Lin | |
| 9,941,241 B2 | 4/2018 | Edelstein et al. | |
| 9,941,243 B2 | 4/2018 | Kim et al. | |
| 9,953,941 B2 | 4/2018 | Enquist | |
| 9,960,142 B2 | 5/2018 | Chen et al. | |
| 10,002,844 B1 | 6/2018 | Wang et al. | |
| 10,026,605 B2 | 7/2018 | Doub et al. | |
| 10,075,657 B2 | 9/2018 | Fahim et al. | |
| 10,204,893 B2 | 2/2019 | Uzoh et al. | |
| 10,269,708 B2 | 4/2019 | Enquist et al. | |
| 10,269,756 B2 | 4/2019 | Uzoh | |
| 10,276,619 B2 | 4/2019 | Kao et al. | |
| 10,276,909 B2 | 4/2019 | Huang et al. | |
| 10,446,456 B2 | 10/2019 | Shen et al. | |
| 10,446,487 B2 | 10/2019 | Huang et al. | |
| 10,446,532 B2 | 10/2019 | Uzoh et al. | |
| 10,508,030 B2 | 12/2019 | Katkar et al. | |
| 10,522,499 B2 | 12/2019 | Enquist et al. | |
| 10,727,219 B2 | 7/2020 | Uzoh et al. | |
| 10,784,191 B2 | 9/2020 | Huang et al. | |
| 10,840,205 B2 | 11/2020 | Fountain, Jr. et al. | |
| 10,923,408 B2 | 2/2021 | Huang et al. | |
| 11,069,734 B2 | 7/2021 | Katkar | |
| 11,195,748 B2 | 12/2021 | Uzoh et al. | |
| 2001/0030367 A1 | 10/2001 | Noguchi et al. | |
| 2002/0042193 A1 | 4/2002 | Noguchi et al. | |
| 2002/0125209 A1 | 9/2002 | Tseng | |
| 2003/0218256 A1 * | 11/2003 | Merchant ......... H01L 21/76807 |
| | | 257/E23.145 |

(56) References Cited

U.S. PATENT DOCUMENTS

| | | | |
|---|---|---|---|
| 2004/0084414 A1 | 5/2004 | Sakai et al. | |
| 2006/0057945 A1 | 3/2006 | Hsu et al. | |
| 2007/0111386 A1 | 5/2007 | Kim et al. | |
| 2011/0241166 A1* | 10/2011 | Chumakov | H01L 29/66545 |
| | | | 257/532 |
| 2011/0241167 A1* | 10/2011 | Feustel | H01L 23/5223 |
| | | | 257/532 |
| 2011/0256715 A1 | 10/2011 | Pan et al. | |
| 2012/0181692 A1* | 7/2012 | Heinrich | H01L 23/485 |
| | | | 438/653 |
| 2013/0214411 A1 | 8/2013 | Kim et al. | |
| 2014/0027664 A1 | 1/2014 | Lei et al. | |
| 2014/0175655 A1 | 6/2014 | Chen et al. | |
| 2015/0064498 A1 | 3/2015 | Tong | |
| 2016/0276169 A1 | 9/2016 | Zhong | |
| 2016/0343682 A1 | 11/2016 | Kawasaki | |
| 2017/0170142 A1 | 6/2017 | Edelstein et al. | |
| 2017/0194204 A1 | 7/2017 | Sowa | |
| 2017/0250160 A1 | 8/2017 | Wu et al. | |
| 2018/0005978 A1 | 1/2018 | Edelstein et al. | |
| 2018/0175012 A1 | 6/2018 | Wu et al. | |
| 2018/0182639 A1 | 6/2018 | Uzoh et al. | |
| 2018/0182666 A1 | 6/2018 | Uzoh et al. | |
| 2018/0190580 A1 | 7/2018 | Haba et al. | |
| 2018/0190583 A1 | 7/2018 | DeLaCruz et al. | |
| 2018/0219038 A1 | 8/2018 | Gambino et al. | |
| 2018/0226375 A1 | 8/2018 | Enquist et al. | |
| 2018/0273377 A1 | 9/2018 | Katkar et al. | |
| 2018/0286805 A1 | 10/2018 | Huang et al. | |
| 2018/0323177 A1 | 11/2018 | Yu et al. | |
| 2018/0323227 A1 | 11/2018 | Zhang et al. | |
| 2018/0331066 A1 | 11/2018 | Uzoh et al. | |
| 2019/0096741 A1 | 3/2019 | Uzoh et al. | |
| 2019/0096842 A1 | 3/2019 | Fountain et al. | |
| 2019/0115277 A1 | 4/2019 | Yu et al. | |
| 2019/0131277 A1 | 5/2019 | Yang et al. | |
| 2019/0198407 A1 | 6/2019 | Huang et al. | |
| 2019/0198409 A1 | 6/2019 | Katkar et al. | |
| 2019/0265411 A1 | 8/2019 | Huang et al. | |
| 2019/0333550 A1 | 10/2019 | Fisch | |
| 2019/0348336 A1 | 11/2019 | Katkar et al. | |
| 2019/0385966 A1 | 12/2019 | Gao et al. | |
| 2020/0013637 A1 | 1/2020 | Haba | |
| 2020/0013765 A1 | 1/2020 | Fountain, Jr. et al. | |
| 2020/0075534 A1 | 3/2020 | Gao et al. | |
| 2020/0118973 A1 | 4/2020 | Wang et al. | |
| 2020/0126906 A1 | 4/2020 | Uzoh et al. | |
| 2020/0194396 A1 | 6/2020 | Uzoh | |
| 2020/0227367 A1 | 7/2020 | Haba et al. | |
| 2020/0294908 A1 | 9/2020 | Haba et al. | |
| 2020/0328162 A1 | 10/2020 | Haba et al. | |
| 2020/0328164 A1 | 10/2020 | DeLaCruz et al. | |
| 2020/0328165 A1 | 10/2020 | DeLaCruz et al. | |
| 2020/0371154 A1 | 11/2020 | DeLaCruz et al. | |
| 2020/0395321 A1 | 12/2020 | Katkar et al. | |
| 2021/0018151 A1 | 1/2021 | Petluri et al. | |
| 2021/0098412 A1 | 4/2021 | Haba et al. | |
| 2021/0181510 A1 | 6/2021 | Katkar et al. | |
| 2021/0193603 A1 | 6/2021 | Katkar et al. | |
| 2021/0193625 A1 | 6/2021 | DeLaCruz et al. | |
| 2021/0242152 A1 | 8/2021 | Fountain, Jr. et al. | |
| 2021/0296282 A1 | 9/2021 | Gao et al. | |
| 2021/0407941 A1 | 12/2021 | Haba | |

FOREIGN PATENT DOCUMENTS

| | | |
|---|---|---|
| JP | 5935227 B2 | 6/2016 |
| JP | 2018-160519 | 10/2018 |
| TW | 430867 B | 4/2001 |
| TW | 557575 B | 10/2003 |
| TW | 579571 B | 3/2004 |
| TW | 201425634 A | 7/2014 |
| WO | WO 2005/043584 A2 | 5/2005 |

OTHER PUBLICATIONS

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Kraft, A. et al., "Long term stability of copper front side contacts for crystalline silicon solar cells," Solar Energy Materials & Solar Cells, 2015, vol. 136, pp. 25-31.

Lee, J.H. et al., "Cell adhesion and growth on polymer surfaces with hydroxyl groups prepared by water vapour plasma treatment," Biomaterials, 1991, vol. 12, pp. 443-448.

Moriceau, H. et al., "Overview of recent direct wafer bonding advances and applications," Advances in Natural Sciences—Nanoscience and Nanotechnology, 2010, 11 pages.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Nascimento, F. et al., "Treatment of PDMS surfaces using pulsed DBD plasmas: comparing the use of different gases and its influence on adhesion," Center for Semiconductor Components, 14 pages.

Oberhammer, J. et al., "Sealing of adhesive bonded devices on wafer level," Sensors and Actuators A, 2004, vol. 110, No. 1-3, pp. 407-412, see pp. 407-412, and Figures 1(a)-1 (l), 6 pages.

Plobi, A. et al., "Wafer direct bonding: tailoring adhesion between brittle materials," Materials Science and Engineering Review Journal, 1999, R25, 88 pages.

Qin, W. et al., "Effect of ammonia plasma pretreatment on silicon-nitride barriers for Cu metallization systems," J. Vac. Sci. Technol. B, Sep./Oct. 2001, vol. 19, No. 5, pp. 1942-1947.

Takeda, K. et al., "Enhanced dielectric breakdown lifetime of Copper/Silicon Nitride/Silicon Dioxide structure," IEEE, 36th Annual International Reliability Physics Symposium, Reno, Nevada, 1998, pp. 36-41.

Van Deynse, A. et al., "Influence of water vapor addition on the surface modification of polyethylene in an argon dielectric barrier discharge," Plasma Processes and Polymers, 2014, vol. 11, pp. 117-125.

Vogt, M. et al., "Dielectric barriers for Cu metallization systems," Microelectronic Engineering, 1997, vol. 37/38, pp. 181-187.

International Preliminary Report on Patentability received for PCT Patent Application No. PCT/US18/52904, mailed on Apr. 9, 2020, 14 pages.

* cited by examiner

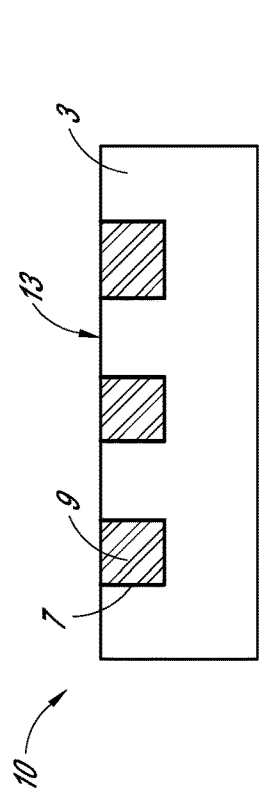
*FIG. 2D*
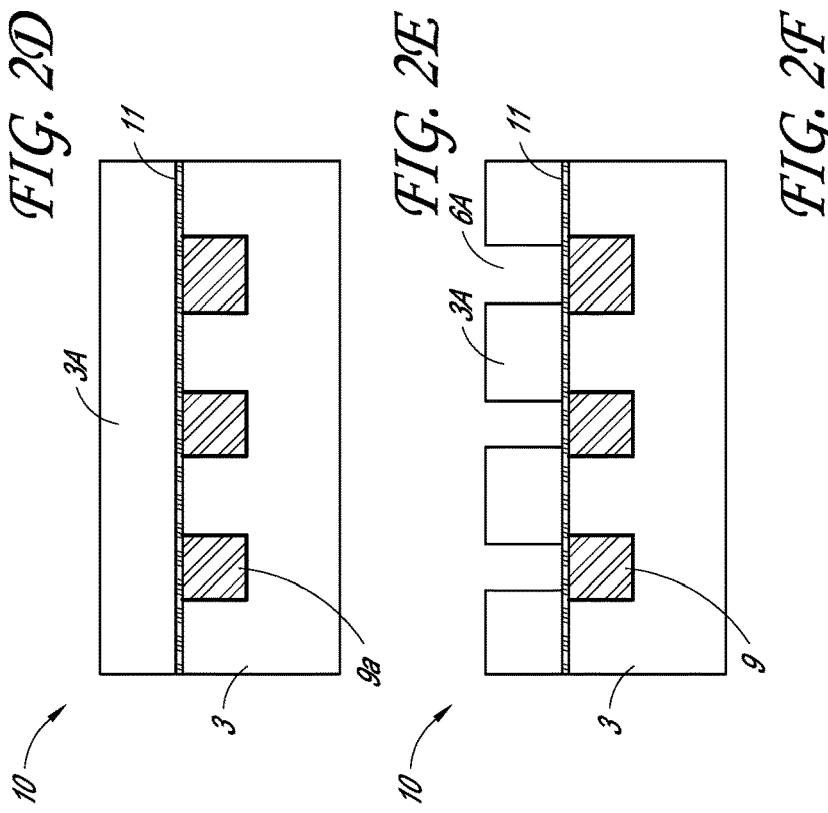
*FIG. 2E*
*FIG. 2F*
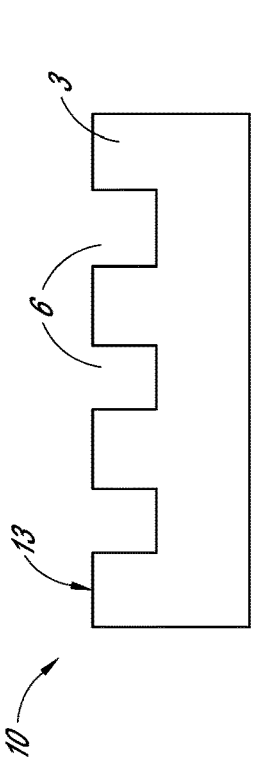
*FIG. 2A*
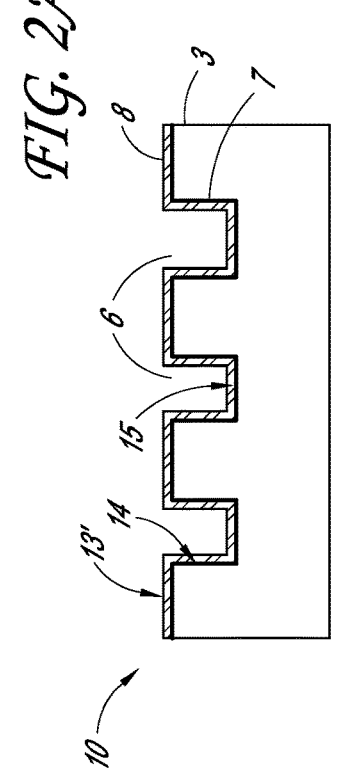
*FIG. 2B*
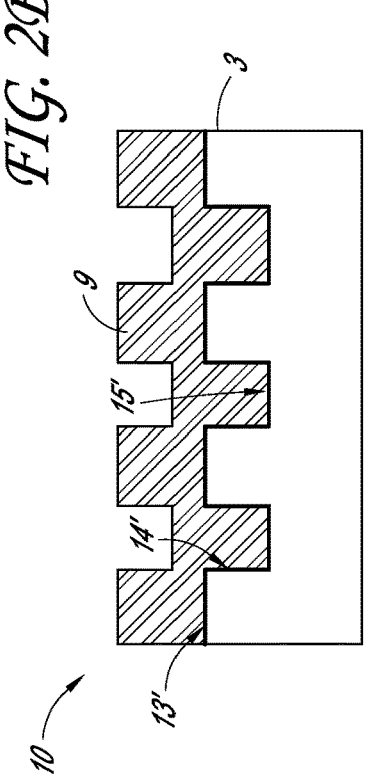
*FIG. 2C*

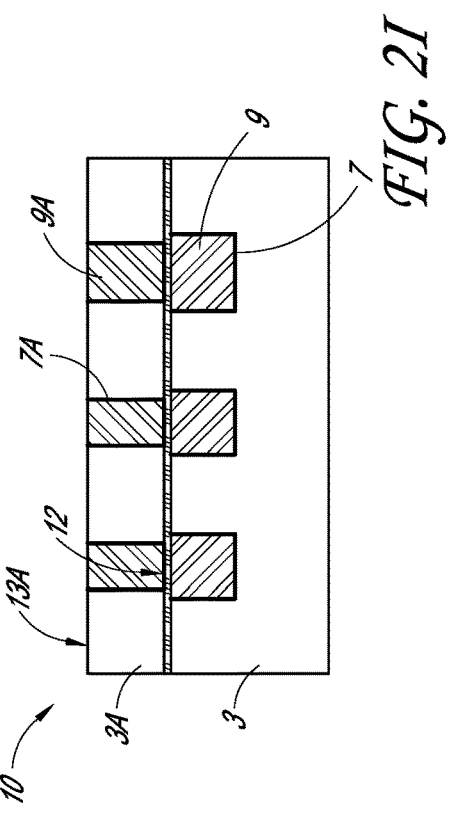
*FIG. 2I*
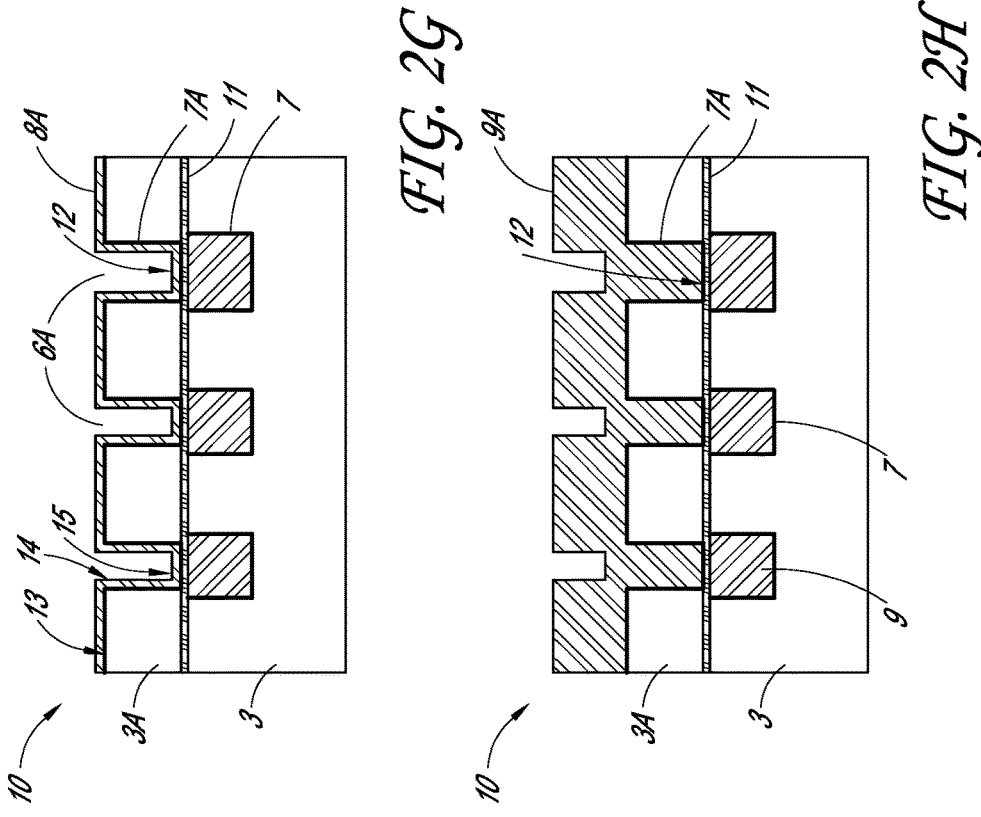
*FIG. 2G*
*FIG. 2H*

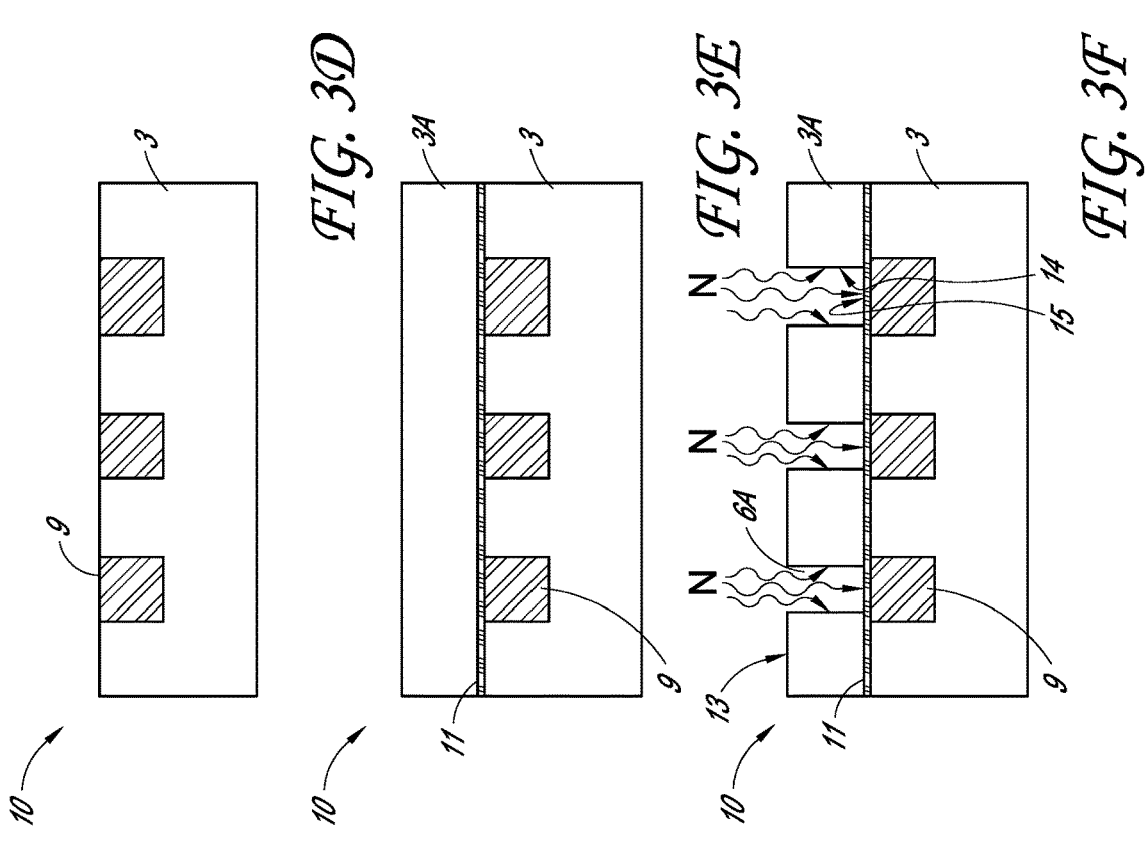
FIG. 3D
FIG. 3E
FIG. 3F
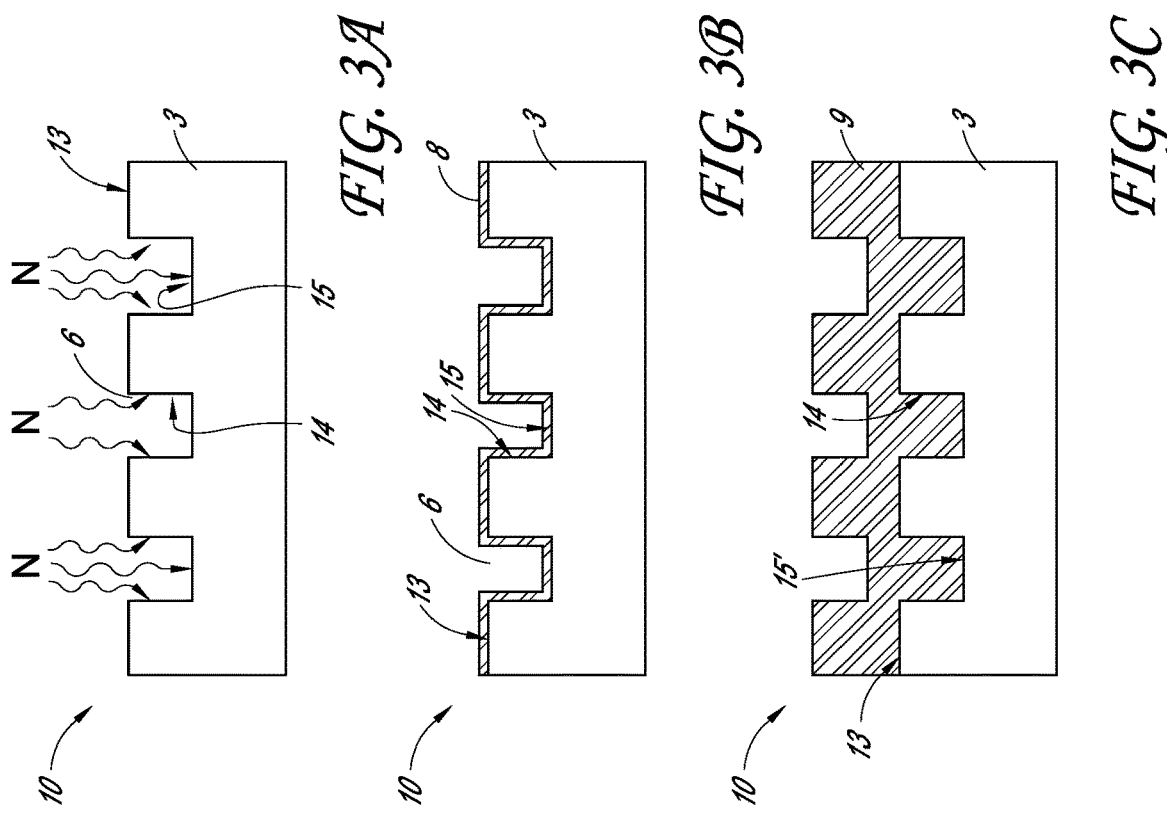
FIG. 3A
FIG. 3B
FIG. 3C

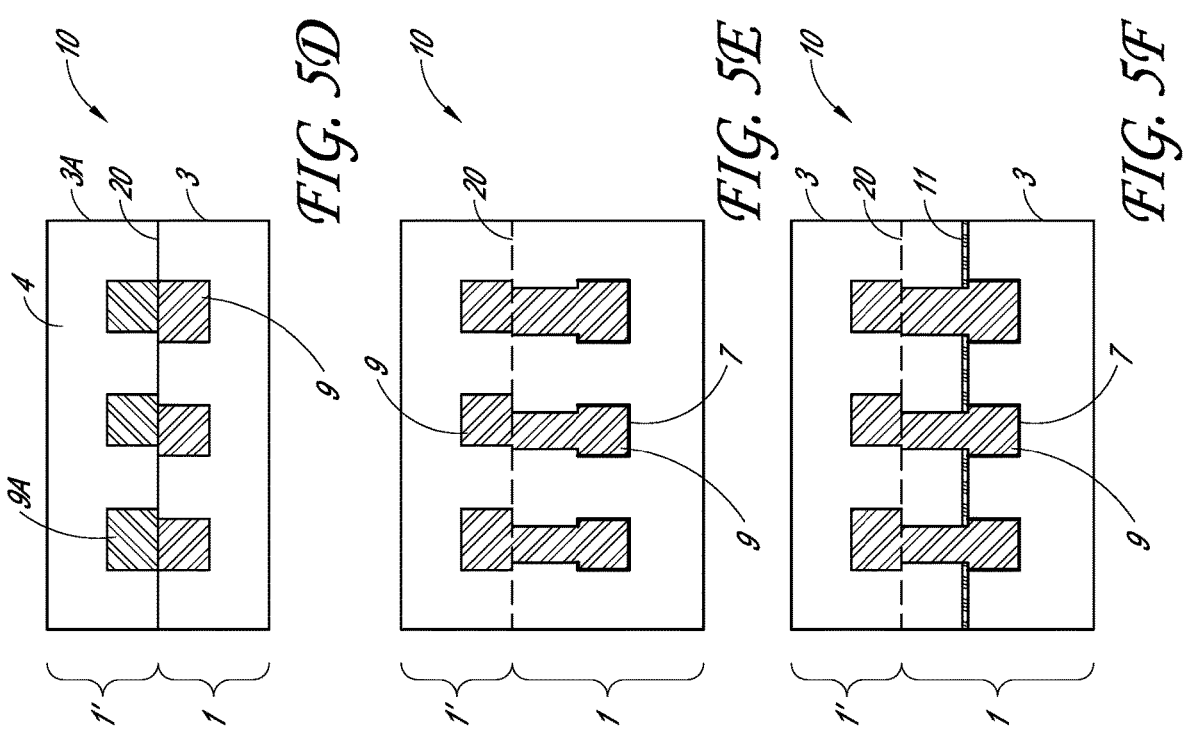
*FIG. 5D*
*FIG. 5E*
*FIG. 5F*
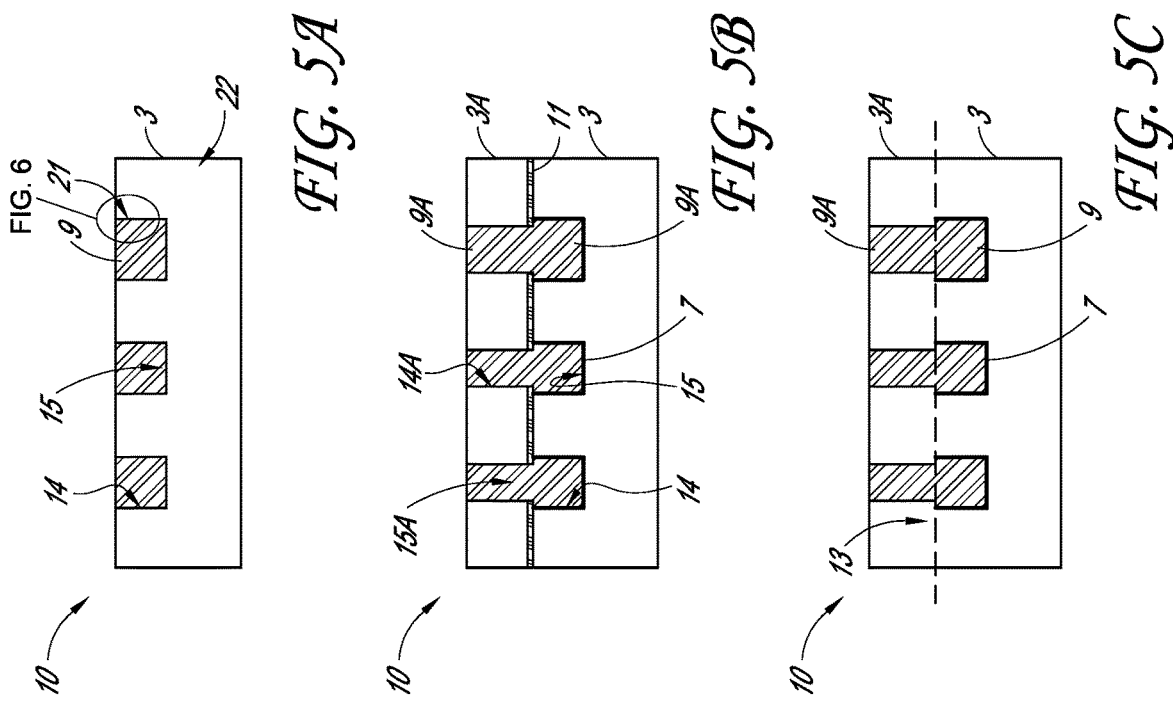
*FIG. 5A*
*FIG. 5B*
*FIG. 5C*

INTERCONNECT STRUCTURES AND METHODS FOR FORMING SAME

CROSS-REFERENCE TO RELATED APPLICATIONS

This application is a continuation of U.S. application Ser. No. 16/140,995, filed on Sep. 25, 2018 which claims priority to U.S. Provisional Patent Application No. 62/564,068, filed Sep. 27, 2017, the entire contents of which are incorporated by reference herein in their entirety and for all purposes.

BACKGROUND

Field

The field relates to interconnect structures and methods for forming the same.

Description of the Related Art

Conductive interconnect structures are used to provide electrical communication among various types of elements, such as among a plurality of semiconductor elements (e.g., between integrated device dies and a substrate or interposer, between stacked integrated device dies, among features within a single die or substrate, etc.). For example, various types of interconnect structures can be formed in or on an element using damascene or dual damascene processing techniques. Some processing techniques for forming interconnect structures may utilize an excessive number of steps or materials, which can increase the manufacturing time and/or cost of the interconnect structures. Moreover, some processing techniques may utilize materials that increase the overall or contact resistance across and/or within the interconnect structure, such as by occupying excessive space in the chip for non-conductive or less conductive materials compared to the primary conductive material. Accordingly, there remains a continuing need for improved interconnect structures and methods for forming interconnect structures.

BRIEF DESCRIPTION OF THE DRAWINGS

FIG. 2A is a schematic side cross-sectional view of an interconnect structure in which cavities are patterned in a non-conductive material.

FIG. 2B is a schematic side cross-sectional view of the interconnect structure of FIG. 2A after providing a barrier layer and a conductive seed layer in the cavities.

FIG. 2C is a schematic side sectional view of the interconnect structure having a conductive material provided over the conductive seed layer.

FIG. 2D is a schematic side sectional view of the interconnect structure after stabilizing the conductive material and planarizing the conductive and non-conductive materials.

FIG. 2E is a schematic side sectional view of the interconnect structure including a protective layer between the non-conductive material and a second non-conductive material.

FIG. 2F is a schematic side sectional view of the interconnect structure after creating second cavities in the second non-conductive material and through the protective layer.

FIG. 2G is a schematic side sectional view of the interconnect structure after providing a second barrier layer and a second seed layer over the second non-conductive material and in the second cavities.

FIG. 2H is a schematic side sectional view of the interconnect structure after providing a second conductive material over the second seed layer.

FIG. 2I is a schematic side sectional view of the interconnect structure after stabilizing the second conductive material and planarizing the second conductive and non-conductive materials.

FIG. 3A is a schematic side cross-sectional view of an interconnect structure in which cavities are patterned in a non-conductive material and surfaces of the non-conductive material are exposed to a surface-treating species, according to one embodiment.

FIG. 3B is a schematic side cross-sectional view of the interconnect structure of FIG. 3A after providing a conductive seed layer in the cavities over the treated surfaces.

FIG. 3C is a schematic side sectional view of the interconnect structure of FIG. 3B having a conductive material provided over the conductive seed layer.

FIG. 3D is a schematic side sectional view of the interconnect structure of FIG. 3C after stabilizing the conductive material and planarizing the conductive and non-conductive materials.

FIG. 3E is a schematic side sectional view of the interconnect structure of FIG. 3D including a protective layer between the non-conductive material and a second non-conductive material.

FIG. 3F is a schematic side sectional view of the interconnect structure of FIG. 3E after creating second cavities in the second non-conductive material and through the protective layer and exposing surfaces of the second non-conductive material to a surface-treating species.

FIG. 5A is a schematic side sectional view of an interconnect structure, according to various embodiments.

FIG. 5B is a schematic side sectional view of an interconnect structure according to various embodiments.

FIG. 5C is a schematic side sectional view of an interconnect structure according to various embodiments.

FIG. 5D is a schematic side sectional view of first and second elements directly bonded to each other without an intervening adhesive, according to various embodiments.

FIG. 5E is a schematic side sectional view of first and second elements directly bonded to each other without an intervening adhesive, according to another embodiment.

FIG. 5F is a schematic side sectional view of first and second elements directly bonded to each other without an intervening adhesive, according to yet another embodiment.

DETAILED DESCRIPTION

Figures 1A, 1B:
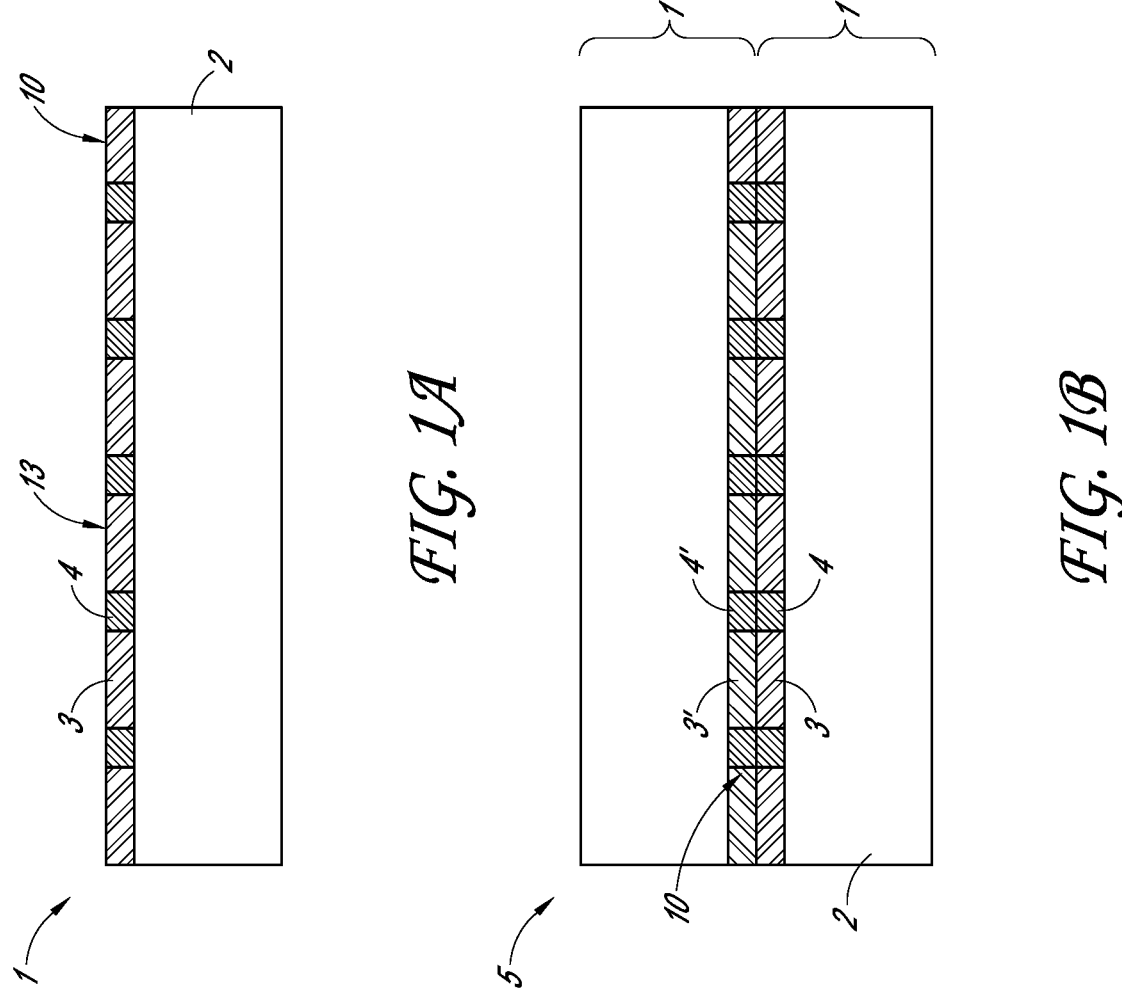
FIG. 1A is a schematic side sectional view of an element having an interconnect structure, according to various embodiments.
FIG. 1B is a schematic side sectional view of a bonded structure, according to various embodiments.
Figure 3I:
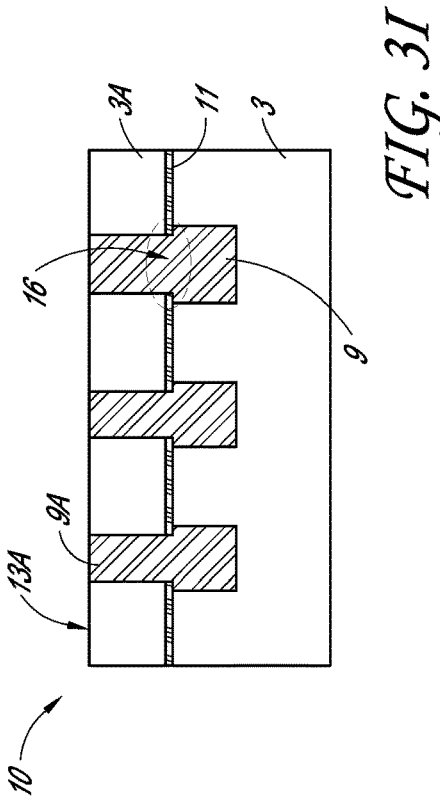
FIG. 3I is a schematic side sectional view of the interconnect structure of FIG. 3H after stabilizing and planarizing the second conductive material.

FIG. 1A is a schematic side sectional view of an element 1 having an interconnect structure 10 configured to provide electrical communication to other elements or structures. As shown in FIG. 1A, the interconnect structure 10 can be provided on a bulk material portion 2 of the element 1, for example, at or near an exterior surface (e.g., top or bottom surface) of the element 1 which can be provided for bonding. The interconnect structure 10 can comprise part of a redistribution layer (RDL) in various embodiments on a die or package, or on a wiring layer in a back-end-of line (BEOL) structure.

The bulk material portion 2 can comprise any suitable material, such as silicon, silicon oxide, ceramics, glass, glass-ceramics, compound semiconductors, diamond, a polymer, flat panels, or various combinations thereof, etc. The element 1 of FIG. 1A can comprise any suitable type of element or device, such as a semiconductor element (e.g., an integrated device die such as a processor die, a memory die, a microelectromechanical systems or MEMS die, etc.), an interposer, an optical device, organic and/or inorganic substrates, package substrates (e.g., ceramic substrates or plastic printed circuit board or PCB substrates), etc. The element 1 can therefore comprise active circuitry and/or devices defined or formed therein or thereon. The interconnect structure 10 can be configured to provide electrical communication between the active circuitry and/or devices of the element 1 and external structures (such as packaging structures, integrated device dies, interposers, substrates, etc.).

In various embodiments, the interconnect structure 10 can include portions that are exposed on a surface, e.g., an upper surface 13, of the element 1. The interconnect structure 10 can include a non-conductive material 3 and a conductive material 4 defined within at least a portion of the non-conductive material 3. The non-conductive material 3 can comprise any suitable type of non-conductive material, including organic and/or inorganic materials. In various embodiments, the non-conductive material 3 comprises an insulating material or dielectric, such as silicon oxide, silicon, silicon nitride, silicon carbide, glass, ceramics, glass-ceramics, liquid crystal, etc. In various embodiments, the non-conductive material 3 can comprise a polymer. In various embodiments, the non-conductive material 3 or the bulk material portion 2 can comprise a Group III-IV material, such as gallium arsenide (GaAs). The non-conductive material 3 can be formed over the bulk material portion 2 in any suitable manner, including, e.g., various deposition processes. The conductive material 4 can comprise any suitable type of conductive material, e.g., a metal. In various embodiments, for example, the conductive material 4 comprises copper, nickel, gold, silver, tin, indium, and alloys thereof. In some embodiments, the conductive material 4 can comprise a magnetic layer, an inductive layer, or a capacitive layer at or near an external bonding surface of the conductive material 4. In various embodiments, the non-conductive material 3 can comprise of one or more layers such as those typically found in back-end-of-line (BEOL) structures or packaging redistribution layers.

FIG. 1B is a schematic side sectional view of a bonded structure 5 comprising the element 1 bonded to a second element 1'. As with the first element 1, the second element 1' can comprise any suitable type of element, including, e.g., a semiconductor element (e.g., an integrated device die such as a processor die, a memory die, a microelectromechanical systems or MEMS die, etc.), an interposer, an optical device, organic and/or inorganic substrates, package substrates (e.g., ceramic substrates or plastic printed circuit board or PCB substrates), etc.

Various embodiments of the elements and interconnect structures disclosed herein can be used in conjunction with any suitable type of bonding technique between two or more elements. In various embodiments, the elements and interconnect structures may not be bonded to other structures (or may be bonded only to a packaging substrate). In various embodiments, a conductive adhesive (such as solder, conductive paste, etc.) can be used to bond two elements to one another. In some embodiments, as shown in FIG. 1B, elements can be bonded to one another by way of direct bonding without an intervening adhesive. In such embodiments, the direct bond between the elements 1, 1' can include a direct bond between corresponding conductive materials 4, 4' of the elements 1, 1' without an intervening adhesive, and/or between corresponding non-conductive materials 3, 3' of the elements 1, 1' without an intervening adhesive, without being limited thereto.

For embodiments that include direct bonding, in some embodiments, respective bonding surfaces of the conductive materials 4, 4' and the non-conductive materials 3, 3' can be prepared for bonding. Preparation can include provision of a nonconductive layer, such as silicon oxide or silicon nitride, with exposed conductive features, such as metal bond pads or contacts. The bonding surfaces of at least the non-conductive materials, or both the conductive and non-conductive materials, can be polished to a very high degree of smoothness (e.g., less than 20 nm surface roughness, or more particularly, less than 1 nm surface roughness). In some embodiments, the surfaces to be bonded may be terminated with a suitable species and activated prior to bonding. For example, in some embodiments, for the interconnect structure 10 the surfaces of the bonding layer to be bonded, such as silicon oxide material, may be cleaned and exposed to a nitrogen-containing solution and terminated with a nitrogen-containing species, preferably in the presence of nitrogen plasma. As one example, the surfaces to be bonded may be exposed to hydroscopic ambient after a nitrogen-containing plasma exposure. In a direct bond interconnect (DBI) process, nonconductive materials 3, 3' of elements 1, 1' can directly bond to one another, even at room temperature and without the application of external pressure, while the conductive materials 4, 4' of the elements 1, 1' can also directly bond to one another, without any intervening adhesive layers. Bonding by DBI forms stronger bonds than Van der Waals bonding, including significant covalent bonding between the surfaces of interest. Subsequent annealing can further strengthen bonds, particularly between conductive features of the bonding interfaces. Furthermore, it should be appreciated that the introduction of moisture (e.g., water vapor) into plasma processes can improve the bonding between the elements 1, 1'. Without being limited by theory, the introduction of hydroxyl and protons from water can provide additional chemical activity at the bonding surface of interest, for example, in dielectric-to-dielectric direct surface bonding applications and particularly for oxide-to-oxide bonding surfaces.

In some direct bonding embodiments, the respective conductive materials 4, 4' can be flush with the exterior surfaces (e.g., the non-conductive materials 3, 3') of the elements 1, 1'. In other embodiments, the conductive materials 4, 4' may extend above the exterior surfaces. In still other embodiments, the conductive materials 4, 4' of one or both of the elements 1, 1' are recessed relative to the exterior surfaces (e.g., non-conductive materials 3, 3') of the elements 3, 3'. For example, the conductive materials 4, 4' can be recessed relative to the non-conductive materials 3, 3' by less than 20 nm, e.g., less than 10 nm.

Once the respective surfaces are prepared, the non-conductive material 3 (such as silicon oxide) of the element 1 can be brought into contact with corresponding non-conductive material 3' of the element 1'. The interaction of the activated surfaces can cause the non-conductive material 3 to directly bond with the corresponding non-conductive material 3' of the element 1' without an intervening adhesive, without application of external pressure, without application of voltage, and at room temperature. In various embodiments, the bonding forces of the non-conductive materials 3, 3' can include covalent bonds that are greater than Van der Waals bonds and exert significant forces between the conductive features. Prior to any heat treatment, the bonding energy of the dielectric-dielectric surface can be in a range from 100-700 mJ/m$^2$, which can increase to 1200-4000 mJ/m$^2$ after a period of heat treatment at high temperature, e.g., at a temperature in a range of 150 to 380° C., e.g., preferably below 450° C. In some embodiments, the heat treatment can be performed at a temperature less than about 200° C., e.g., less than about 150° C. In some embodiments utilizing higher temperature processing, the final treatment temperature may be as high as 1100° C. for times ranging from less than 1 second to more than 60 seconds. Regardless of whether the conductive materials 4, 4' are flush with the non-conductive materials 3, 3', are recessed or protrude, direct bonding of the non-conductive materials 3, 3' can facilitate direct metal-to-metal bonding between the conductive materials 4, 4'. In various embodiments, the elements 1, 1' may be heated after bonding at least the non-conductive materials 3, 3'. As noted above, such heat treatment can strengthen the bonds between the non-conductive materials 3, 3', between the conductive materials 4, 4', and/or between opposing conductive and non-conductive materials. In embodiments where one or both of the conductive materials 4, 4' are recessed, there may be an initial gap between the conductive materials 4, 4' of the elements 1, 1', and heating after initially bonding the non-conductive materials 3, 3' can expand the conductive materials 4, 4' to close the gap. Regardless of whether there was an initial gap, heating can generate or increase pressure between the conductive materials of the opposing parts, aid bonding of the conductive materials and form a direct electrical and mechanical connection.

Additional details of the direct bonding processes used in conjunction with each of the disclosed embodiments may be found throughout U.S. Pat. Nos. 7,126,212; 8,153,505; 7,622,324; 7,602,070; 8,163,373; 8,389,378; and 8,735,219, and throughout U.S. patent application Ser. Nos. 14/835,379; 62/278,354; 62/303,930; and 15/137,930, the contents of each of which are hereby incorporated by reference herein in their entirety and for all purposes.

FIGS. 2A-2I illustrate a method for forming an interconnect structure 10 of an element. The embodiment of FIGS. 2A-2I may be useful whether or not employed in conjunction with direct bonding as described above with respect to FIGS. 1A-1B above. For ease of illustration, only portions of the interconnect structure 10 are illustrated, and the remainder of the element 1 (including the bulk material portion 2 and any devices, such as semiconductor devices, partially formed therein) is not shown in FIGS. 2A-2I. In FIGS. 2A-2I, the interconnect structure 10 comprises a non-conductive material 3, which may be similar to the non-conductive material 3 described above in FIGS. 1A-1B. In various embodiments, for example, the non-conductive material 3 can comprise a silicon oxide based material, e.g., silicon oxide. In various embodiments, the silicon oxide based material may be doped with other species. FIG. 2A is a schematic side cross-sectional view of the interconnect structure 10 in which cavities 6 are patterned in the non-conductive material 3. In various embodiments, for example, the cavities 6 can be etched in the non-conductive material 3 to any suitable depth. The shape of the etched cavities 6 may comprise one or more troughs, trenches, vias or combinations thereof, as in dual damascene structures. In some applications, the cavities may comprise troughs that include multiple vias extending from the bottoms thereof. In some arrangements, the cavities 6 comprise blind holes or trenches that are useful for forming elongated lines or traces therein, as shown in 2A. In other arrangements, the cavities 6 can comprise through holes, e.g., for formation of vias.

Turning to FIG. 2B, a barrier layer 7 (e.g., a conductive barrier layer) can be provided over an exposed upper surface 13 of the non-conductive material, over sidewalls 14 of the cavities 6, and over bottom surfaces 15 of the cavities 6. The barrier layer 7 can be applied or deposited in any suitable way, including, e.g., by any suitable deposition process such as by ionized physical vapor deposition (PVD), atomic layer deposition (ALD), chemical vapor deposition or combinations thereof. The barrier layer 7 can comprise a conductive material, such as tantalum (Ta), tantalum nitride (TaN), titanium nitride (TiN), TaSiN, CoWP, TiW, nickel alloys or any other suitable barrier layers. The barrier layer 7 may comprise laminate structures, for example, TaN/Ta. Typically, the barrier layer 7 is more resistive than the subsequently formed conductive layer 9 (see FIGS. 2C-2I). As an example the resistivity of the barrier layer 7 (e.g., TaN) may vary between 250 to 10000 micro ohm-cm compared to that of the conductive layer 9 (e.g., copper) with resistivity in a range of 1.5 micro ohm-cm to 50 micro ohm-cm, in a range of 1.5 micro ohm-cm to 25 micro ohm-cm, or in a range of 1.7 to 3 micro ohm-cm depending on, e.g., alloying or impurity (or impurities) concentration. Furthermore, as shown in FIG. 2B, a conductive seed layer 8 can be provided over the barrier layer 7. The conductive seed layer 8 can be applied or deposited in any suitable way, including, e.g., by any suitable deposition process, electroless plating, sputtering, etc. The conductive seed layer can comprise any suitable conductor, including, e.g., copper, nickel, ruthenium, indium, gallium or other metals. In various embodiments, the conductive seed layer 8 can comprise a metal alloy comprising a mixture of two or more metallic materials.

In FIG. 2C, a conductive material 9 can be provided over the conductive seed layer 8, including over an upper surface 13' of the seed layer 8, over sidewalls 14' of the seed layer 8', and over bottom surfaces 15' of the seed layer 8. The conductive material 9 can be provided over the seed layer 8 in any suitable manner, including, e.g., depositing the conductive material onto the seed layer by sputtering using a plasma source, by atomic layer deposition (ALD), by chemical vapor deposition (CVD), electroplating or electroless deposition, etc. In various embodiments, the conductive material 9 can be provided over the seed layer 8 using at least one of electrodeposition, physical vapor deposition, chemical vapor deposition, and atomic layer deposition. In the arrangement of FIGS. 2B-2C, the barrier layer 7 can provide improved adhesion between the non-conductive material 3 and the conductive material 9 (and/or the seed layer 8). In various embodiments, the barrier layer 7 can have a resistance value in a range of 50 to 5000 μΩ-cm. In some embodiments, the conductive material 9 can have a resistance value in a range of 1.7 to 4μΩ-cm. Accordingly, in various embodiments, the conductive material 9 can have a resistance value less than 50 μΩ-cm, or less than 40 μΩ-cm.

By contrast, if the seed layer 8 and/or conductive material 9 were directly applied to the non-conductive material 3 without a barrier layer, in various situations, the conductive material 9 and/or seed layer 8 may delaminate, or otherwise separate or be ripped from the non-conductive material 3. For example, in arrangements in which the non-conductive material 3 comprises silicon oxide and the conductive material 9 (and/or seed layer 8) comprises copper, directly depositing the conductive material 9 (and/or seed layer 8) over the non-conductive material 3 may result in poor adhesion between the conductive material 9 relative to the non-conductive material 3. Such poor adhesion may cause the conductive material 9 (and/or seed layer 8) to separate from the non-conductive material 3 during subsequent processes. Providing the barrier layer 7 between the non-conductive material 3 and the conductive material 9 can improve the adhesion of the conductive material 9 in connection with the arrangement shown in FIGS. 2A-2I. In addition, in some arrangements, the barrier layer 7 can reduce migration of the conductive material 9 into the non-conductive material 3. Further, copper adheres poorly to silicon oxide, such that providing deposited adhesion or barrier layers between copper and oxide is standard practice in the art. Similar integration issues exist for other metals and insulators.

FIG. 2D is a schematic side sectional view of the interconnect structure 10 after stabilizing the conductive material 9 (e.g., by thermal treatment) and planarizing the conductive and non-conductive materials 9, 3. For example, as shown in FIG. 2C, the conductive material 9 may include portions that extend above the upper surface 13' defined by the barrier layer 7. In FIG. 2D, the portions of the conductive material 9 extending above the upper surface 13' may be stabilized, e.g., the grain structure of the plated conductive material 9 can be stabilized by at least one of thermal treatment, resting (room temperature annealing), ion beam annealing, and electron beam annealing. Further, the stabilized conductive material 9 can be planarized to a relatively high degree of surface smoothness. In various arrangements, for example, the conductive material 9 can be polished, e.g., by chemical-mechanical polishing (CMP) or other methods to provide a smooth surface for further processing. At least one type of polishing slurry may be used to remove the unwanted portion of the conductive layer 9, for example, a copper layer, using the barrier layer surface as a polishing stop. Then, a different type of slurry or planarization process can be used to remove the barrier layer 7 using the dielectric surface beneath the barrier layer 7 as the barrier layer polishing stop. In some arrangements, the conductive layer 9 planarization step may be performed on a polishing pad that is different from that used for polishing off the barrier layer 7. In some embodiments, the planarized surface can be processed for direct bonding, e.g., the planarized upper surface 13 can be directly bonded to another structure (e.g., a second element 1') without an intervening adhesive, as explained above. The conductive material 9 shown in FIGS. 2D-2F can have a width that is less than a micron, e.g., a width in a range of 0.2 um to 1 um, in a range of 0.2 um to 100 um, in a range of 0.5 um to 100 um, in a range of 1 um to 100 um, or in a range of 0.2 um to 500 um.

Turning to FIG. 2E, a protective layer 11 can be provided over the planarized conductive material 9 and non-conductive material 3. The protective layer 11 (e.g., an interlayer dielectric) can comprise any suitable non-conductive material, including, e.g., silicon nitride, silicon carbide, silicon oxynitride, etc. A second non-conductive material 3A (which may be the same as or different from the non-conductive material 3) can be provided over the protective layer 11 to further build up layers of the interconnect structure 10. Any suitable number of layers can be provided to the interconnect structures 10 disclosed herein. The protective layer 11 can improve adhesion between the non-conductive material 3 and the second non-conductive material 3A, as compared to arrangements in which the second non-conductive material 3A (e.g., silicon oxide) is provided directly over the non-conductive material 3 (e.g., silicon oxide) without the intervening protective layer 11.

FIG. 2F is a schematic side sectional view of the interconnect structure 10 after creating second cavities 6A in the second non-conductive material 3A and through the protective layer 11. As with the structure shown in FIG. 2A, the cavities 6A can be formed using any suitable technique, including any suitable etching technique. In various arrangements, the interconnect structure 10 can be masked, and a first etch process can be performed through the second non-conductive material 3A to expose portions of the protective layer 11 overlying the conductive material 9, with the protective layer 11 acting as an etch stop. A second etch process can be performed through portions of the protective layer 11 to expose the conductive material 9. Any suitable etch processes (including wet etching, reactive ion etching (ME), etc.) can be used in the arrangement of FIG. 2F.

Turning to FIG. 2G, a second barrier layer 7A can be provided over upper surfaces 13 of the second non-conductive material 3A, sidewalls 14 of the cavities 6, and bottom surfaces 15 of the cavities 6A. A second seed layer 8A can be provided over the second barrier layer 7A. As shown in FIG. 2G, portions 12 of the second barrier layer 7A can be provided over exposed portions of the conductive material 9.

FIG. 2H is a schematic side sectional view of the interconnect structure 10 after providing a second conductive material 9A over the second seed layer 8A. In FIG. 2I, the second conductive material 9A can be stabilized and planarized as explained above in connection with FIG. 2D. As above, a planarized upper surface 13A of the interconnect structure 10 can be further processed for providing additional interconnect layers above the upper surface, or for bonding (e.g., direct bonding) to another structure or element.

In the interconnect structure 10 shown in FIG. 2I, the portion 12 of the barrier layer 7A intervenes between the conductive materials 9, 9A. However, the barrier layer 7A (which may comprise a relatively high resistance barrier layer relative to copper or other bulk conductors for the conductive materials 9, 9A, such as Ta, TaN, TiN, TaSiN, CoWP, etc.), may increase the contact resistance between the conductive materials 9, 9A of the interconnect structure 10 which may decrease the performance of the element 1. Furthermore, as shown in FIG. 2I, portions of the protective layer 11 may remain in undesirable locations between the non-conductive materials 3, 3A. Also, errors in the barrier removal step may leave undesirable barrier residues in portion of the polished surface 13 or 13A, resulting in defects in subsequent steps. For example, barrier layer residues of the surface of the dielectric layer 3 or 3A may prevent intimate contact between the planarized dielectric bonding surfaces around the undesirable barrier residue. Similarly, any barrier layer at the peripheries of the cavity 6 protruding over the polished dielectric surface 13 or 13A may prevent the bonding surfaces from intimate contact around the protruding barrier layer 7 defect. Including the barrier layer 7A and the protective layer 11 utilizes additional processing steps (e.g., multiple depositions), which can disadvantageously increase processing complexity, processing time, and processing costs. Accordingly, there remains a continuing need for improved interconnect structures that address these and other issues.

Various embodiments disclosed herein relate to interconnect structures 10 that provide reduced processing costs, reduced contact resistance, and a simpler process flow, as compared with the method shown in FIGS. 2A-2I. In various embodiments, herein, for example, a method for forming an interconnect structure 10 in an element 1 is disclosed. The method can include patterning a cavity 6 in a non-conductive material 3 (e.g., silicon oxide in various embodiments). A surface of the cavity 6 of the non-conductive material 3 can be exposed to a surface nitriding treatment. In various embodiments, the surface of the cavity 6 can be exposed to a surface treatment having similar adhesive characteristics to a surface nitriding treatment. For example, the surface of the non-conductive material 3 can be exposed to a nitrogen-containing plasma, or to a plasma that contains a species having similar adhesion characteristics of a nitrogen-containing plasma. In various embodiments, the surface of the non-conductive material 3 can be exposed to a nitrogen-containing plasma comprising water vapor (e.g., moisture) to improve reactivity and adhesion, especially for organic materials. In various embodiments, before exposing the surface of the non-conductive material 3 to the surface nitriding treatment, the surface can be pre-treated with one or more of carbon (C), boron (B), cobalt (Co), and manganese (Mn) sources. In one example the cleaned non-conductive material 3 may be exposed to silane gas prior to the nitriding process.

A conductive material (e.g., copper), which can comprise a seed layer and thicker bulk conductor, can be deposited directly onto the treated surface after the exposing. Intervening deposited adhesion and barrier layers can be omitted. In various embodiments, for example, the conductive material 9 may comprise copper, nickel, gold, silver, tin, indium, aluminum, ruthenium, tungsten, platinum or other noble metals and alloys thereof. In various embodiments, the non-conductive material 3 can comprise one or more layers such as those typically found in BEOL structures or packaging redistribution layers.

The non-conductive material 3 can comprise a primary region and an interface region. The interface region of the non-conductive material 3 can be disposed between the conductive material 9 and the primary region of the non-conductive material 3. The non-conductive material of the interface region can be nitridized by the surface nitriding treatment, e.g., dissociated nitrogen containing molecules can penetrate and/or bond with the non-conductive material 3 to form for example a nitrogen rich or nitrogen modified non-conductive layer. Beneficially, the nitridized interface region can improve the adhesion between the conductive material 9 and the non-conductive material 3, without incorporating the additional deposition steps and/or cost of including a separate barrier layer between the conductive material 9 and the non-conductive material 3. The nitridized surface of the non-conductive surface can advantageously serve the functions of separate adhesion and/or barrier layers without occupying precious space within the cavity, allowing for greater volume of the conductive material 9, lowering overall resistance and thus providing greater circuit speeds compared to the traditional structures incorporating a barrier layer 7 surrounding the conductive layer 9 within the non-conductive cavity 6. Furthermore, in some embodiments, the upper surface of the non-conductive material 3 can be nitridized before applying a second non-conductive material 3A, which can beneficially eliminate the use of a protective, interlayer dielectric layer 11. Modifying the surface of the dielectric layer by nitride treatment is a distinction from conventional methods of depositing a nitride layer, such as silicon nitride, by, e.g., chemical vapor deposition (CVD), plasma enhanced chemical vapor deposition (PECVD), physical vapor deposition (PVD) also known as sputtering, reactive sputtering, atomic layer deposition (ALD), or plasma enhanced atomic layer deposition (PEALD) methods. In conventional deposition processes, a silicon nitride dielectric layers or conductive barrier materials are typically deposited to significant thicknesses, e.g., typically 50 nm to 2000 nm may be deposited on the desired surface. In contrast to deposited layers, such as interlayer dielectric layer 11, the nitridized layer at the surface of the non-conductive layer may be typically less than 10 nm, e.g., less than 5 nm. In one embodiment, the nitrogen modified non-conductive layer surface may comprise stoichiometric $Si_3N_4$, or nitrogen-deficient silicon nitride or silicon oxynitride, or a silicon carbide nitrogen compound or complex.

Figure 7:
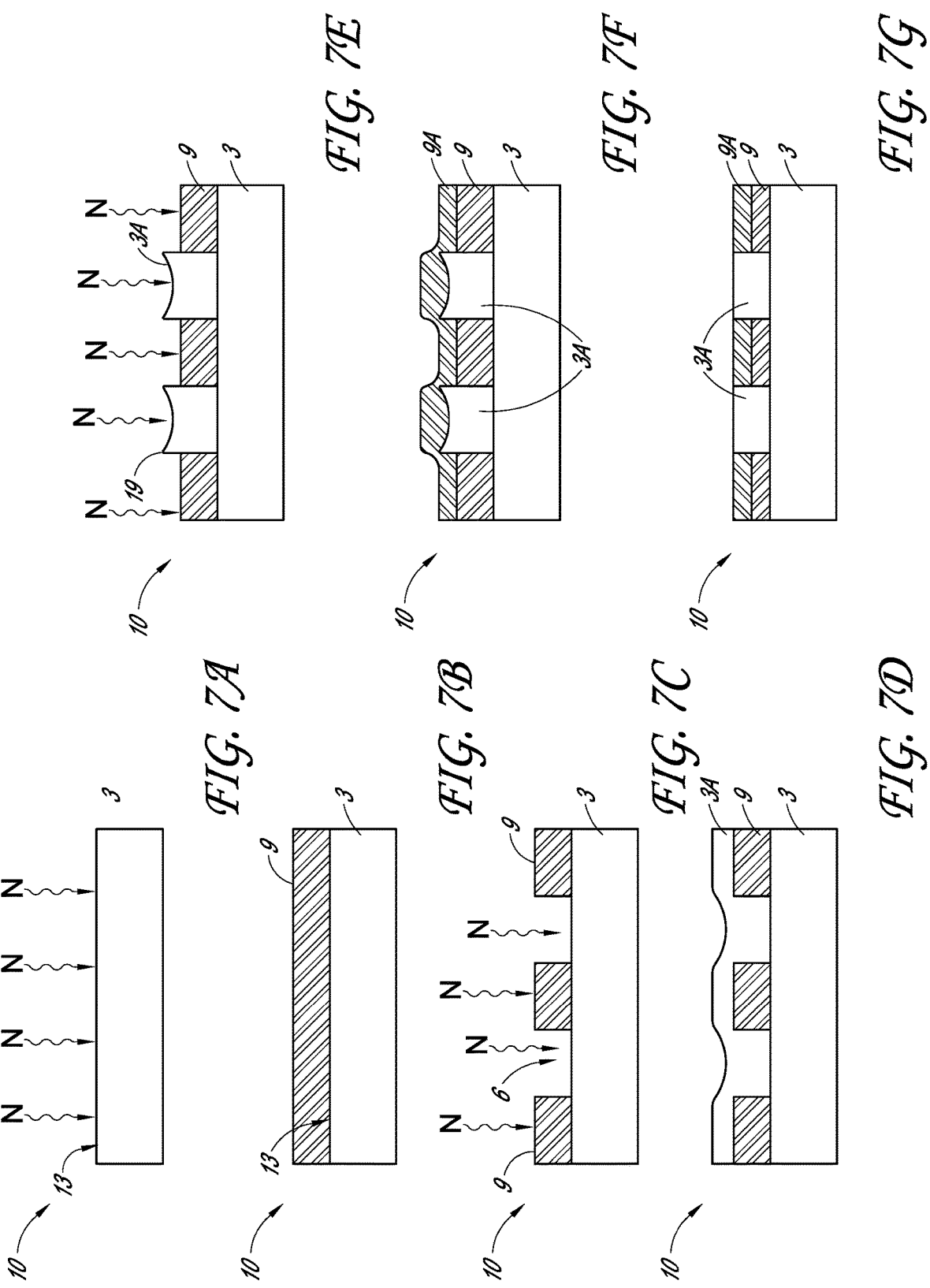
FIG. 7A is a schematic side sectional view of an interconnect structure in which the upper surface of the non-conductive material is exposed to a surface-treating species without patterning cavities in the non-conductive material, according to various embodiments.
FIG. 7B is a side sectional view of the interconnect structure after depositing the conductive material over the treated surface of the non-conductive material.
FIG. 7C is a schematic side sectional view of the interconnect structure after patterning the conductive material.
FIG. 7D is a schematic side sectional view of the interconnect structure after depositing another layer of non-conductive material over the conductive material and in the cavities over exposed portions of the non-conductive material.
FIG. 7E is a schematic side sectional view of the interconnect structure after exposing the conductive material underlying the additional non-conductive material.
FIG. 7F is a schematic side sectional view of the interconnect structure after depositing an additional conductive material over the treated, exposed surfaces of the non-conductive material and the conductive material.
FIG. 7G is a schematic side sectional view of the interconnect structure after planarizing portions of the additional conductive material and the additional non-conductive material.

FIGS. 3A-3I illustrate steps of a method for forming an interconnect structure in an element, according to various embodiments. The embodiment of FIGS. 3A-3I may be useful whether or not employed in conjunction with direct bonding as described above with respect to FIGS. 1A-1B above. As with FIG. 2A, in FIG. 3A, one or a plurality of cavities 6 can be formed in the non-conductive material 3. As with FIG. 2A, the cavities 6 can be formed in any suitable manner, including, e.g., by etching trenches to a desired depth. As with FIG. 2A, the cavities 6 can comprise blind holes or laterally extending trenches, as discussed with respect to FIG. 3A. In other arrangements, the cavities 6 can comprise through holes, e.g., for formation of vias or other electrical interconnects. In still other arrangements, as shown in FIG. 7, no cavities may be provided. Further, as with FIG. 2A, the non-conductive material 3 can comprise any suitable non-conductive material, including a silicon oxide based material (e.g., silicon oxide, doped silicon oxide, etc.), silicon nitride, silicon carbide, organic and/or inorganic dielectrics, polymers (e.g., polyimide), Group III-IV materials (e.g., GaAs), aluminum oxide, diamond, diamond like glass, glass, ceramics, glass-ceramics, liquid crystal, flat panel and combinations thereof.

Unlike the structure shown in FIG. 2A, however, in FIG. 3A, exterior surfaces of the non-conductive material 3 can be exposed to a surface-treating species N prior to application of a seed layer, e.g., without depositing a separate layer. For example, in various embodiments, the surface-treating species N can be provided to the exposed surfaces 13, 14, 15 of the non-conductive material 3 with a plasma. In other embodiments, the surface-treating species N may be provided to only the exposed sidewall and bottom surfaces 14, 15 of the cavities 6. In various embodiments, for example, the surface-treating species N can comprise nitrogen, e.g., by way of a surface nitriding process, such as a nitrogen-containing plasma (for example, a plasma reactive ion etching, or RIE, process). In various embodiments, exposing the surfaces 13, 14, and/or 15 to the nitrogen-containing plasma comprises exposing the surface 13, 14, and/or 15 to reactive nitrogen species, including neutral radicals and/or ions. The reactive nitrogen species can be generated in any suitable manner, including, e.g., through dissociation of nitrogen-containing molecules, the nitrogen-containing molecules comprising at least one of molecular nitrogen, ammonia, or any small molecule comprising at least one azide functional group. Other types of surface-treating species N can be used in some embodiments. Unlike deposition processes, the nitriding processes disclosed herein react nitrogen (or other surface-treating species) with the underlying non-conductive material 3 (e.g., silicon oxide) to incorporating the surface-treating species into the non-conductive material 3 without depositing a conventional separate dielectric layer. Further, in the disclosed nitriding processes, it should be appreciated that additional species (such as hydrogen, oxygen, argon, helium, water vapor, diborane, phosphorus, methane, a carbon-based gas, or a boron source etc.) may also be provided with the nitrogen surface treatment species. These additional species may also be found at the interface region between the conductive material 9 and the primary region of the non-conductive material 3. In the embodiment of FIG. 3A, the surface-treating species N can react with the non-conductive material 3 to form a chemical compound of the surface-treating species N and the non-conductive material 3. Thus, unlike deposition processes, in the arrangement of FIG. 3A, the surface treating species N (such as nitrogen) can react with a portion of the non-conductive material 3 (e.g., a silicon oxide based material) to form a compound. In the case of using a silicon oxide based material for the non-conductive material 3 and nitrogen for the surface treating species N, the surface of the non-conductive material 3 can be nitridized to form a compound comprising silicon oxide and nitrogen, e.g., silicon oxynitride. In one embodiment, the reacted surface may exhibit a gradient of the surface-treating species extending from the surface of the non-conductive material 3, 3A to less than 20 nm within the said non-conductive layer.

Turning to FIG. 3B, the seed layer 8 can be provided directly over the treated surfaces 13, 14, and/or 15 of the non-conductive material 3. In some embodiments, the treated surface of the non-conductive material 13, 14 may not be sputter cleaned prior to the deposition of the seed layer 8. Beneficially, the treated surfaces 13, 14, and/or 15 can provide improved adhesion between the non-conductive material 3 and the conductive material of the seed layer 8 (and the subsequently-applied conductive material layer 9) without the use of a separately deposited barrier layer 7 and/or adhesion layer. In various embodiments in which the non-conductive material 3 comprises a silicon oxide based material (e.g., silicon oxide) and the seed layer 8 (and/or conductive material 9) comprises copper, for example, nitrogen-treated surfaces (e.g., by way of a nitrogen-containing plasma) can significantly improve adhesion between the conductive layer 9, for example copper or nickel, and the non-conductive material 3 (e.g., silicon oxide). As explained above, however, for different material combinations, different surface-treating species N may be provided on the surfaces 13, 14, and/or 15, which provide similarly suitable adhesive properties.

Thus, as compared with the arrangement of FIG. 2B, an intervening and separate barrier or adhesion layer (e.g., layer 7) need not be incorporated into the embodiment of FIG. 3B. Accordingly, the embodiment of FIG. 3B can reduce processing costs and processing complexity as compared to other arrangements, while improving the adhesion of the conductive material 9 (e.g., copper) to the non-conductive material 3 (e.g., silicon oxide) and maintaining a diffusion barrier between the conductive material 9 and the non-conductive material 3. Moreover, the surface-treating species N can improve the diffusion barrier of oxide, e.g., in embodiments that utilize nitrogen as the species N. In some embodiments, the diffusion barrier can be further improved by using nitrogen and carbon as the species N.

Moving to FIG. 3C, as with FIG. 2C, the conductive material 9 can be applied (e.g., deposited) over the seed layer 8. As explained above with respect to FIG. 3B, however, the nitridized surfaces of the non-conductive material 3 can provide adequate adhesion of the conductive material 9 (and/or the seed layer 8) to the non-conductive material 3. In FIG. 3D, the conductive material 9 can be stabilized and planarized as explained above in relation to FIG. 2D. And, as with FIG. 2E, in the embodiment of FIG. 3E, the protective layer 11 (which can comprise silicon nitride, silicon carbide, silicon oxynitride, etc.) can be provided over the non-conductive material 3 and the conductive material 9. As shown in FIG. 3D, the conductive material can fill at least 50% of a depth of the cavities 6 (which may also be true of the other embodiments disclosed herein). In some embodiments, the second non-conductive material 3A can be provided (e.g., deposited) on the protective layer 11. In some embodiments, the protective layer 11 can provide improved adhesion between the non-conductive material 3 and the second non-conductive material 3A. In the embodiment of FIG. 3E, the upper surface 13 of the non-conductive material 3 may or may not have been nitridized, such that the protective layer 11 can provide improved adhesion between the non-conductive materials 3, 3A.

In FIG. 3F, second cavities 6A are patterned in the second non-conductive material 3A. As above, the protective layer 11 can act as an etch stop for a first etch process through the second non-conductive material 3A. In some embodiments, an additional etch process can etch through the portions of the protective layer 11 disposed over the conductive material 9 so as to expose the conductive material 9. Other ways of patterning the non-conductive material 3A and the protective layer 11 may be suitable.

In FIG. 3F, unlike in FIG. 2F, the surfaces 13, 14, 15 can be exposed to a surface-treating species N, which may comprise nitrogen or other suitable treatment species, as explained above. In some embodiments, each surface 13, 14, 15 is exposed to the surface treatment N. In other embodiments, however, only the sidewall and bottom surfaces 14, 15 may be exposed to the surface treatment N while the field regions 13 are masked. As explained above, the surface treatment N can comprise a plasma (e.g., plasma RIE) comprising the surface treating species, such as nitrogen. In FIG. 3F, portions of the exposed conductive material 9 and the non-conductive material 3 can be exposed to the surface-treating species N, e.g. a nitrogen-based plasma. In such embodiments, the surface-treating species N can diffuse through both the conductive material 9 and the non-conductive material 3, although the non-conductive material 3 can include significantly more of the species N than the conductive material 9.

Figure 3G:
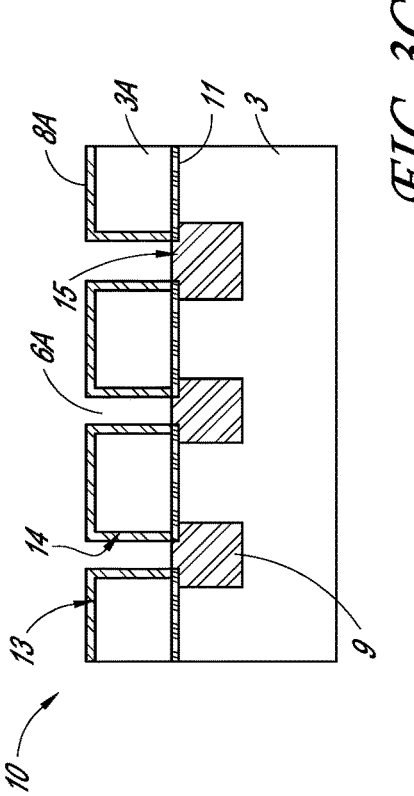
FIG. 3G is a schematic side sectional view of the interconnect structure of FIG. 3F after providing a second seed layer over treated surfaces of the second non-conductive material and in the second cavities.

Turning to FIG. 3G, the seed layer 8A may be provided over the treated surfaces 13, 14, and/or 15. As explained above with respect to FIG. 2G, no barrier layer is needed for improving adhesion between the non-conductive material 3 and the conductive seed layer 8A. Rather, the treated surface (e.g., nitrogen-treated surface) can provide sufficient adhesion between the conductive material 9 (e.g., copper) and the non-conductive material 3 (e.g., silicon oxide).

Figure 3H:
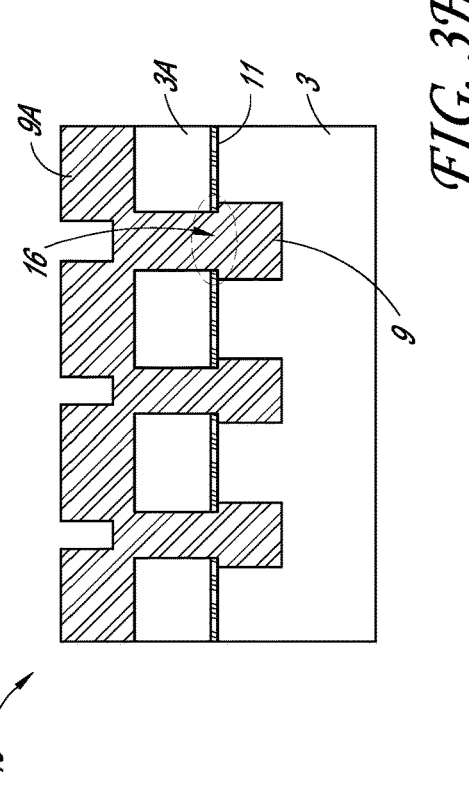
FIG. 3H is a schematic side sectional view of the interconnect structure of FIG. 3G after providing a second conductive material over the second seed layer.

Moving to FIG. 3H, the second conductive material 9A can be provided (e.g., deposited) over the seed layer 8A and within the second cavities 6A. As shown in FIG. 3H, beneficially, a conductive interface region 16 between the conductive material 9 and the second conductive region 9A may comprise a generally continuous conductive region without an intervening barrier layer (such as the intervening second barrier layer 7A of FIG. 2H). The conductive interface region 16 without the barrier layer can provide reduced contact resistance between the conductive material 9 and the second conductive material 9A, while improving adhesion of the conductive and non-conductive materials 9, 3 and maintaining a sufficient barrier to migration of the conductive material 9 (e.g., copper) into the non-conductive material 3 (e.g., silicon oxide). As explained above, in some embodiments, the conductive interface region 16 can comprise at least some of the surface-treating species N, such that, at the interface between the layers 9, 9A, there may be a spike in concentration of the species N, as compared with the portions of the layers 9, 9A that are below or above the interface. In some embodiments, the interface region 16 may comprise trace amounts of the species N.

As explained above, in FIG. 3I, the second conductive material 9A can be stabilized and planarized. In some embodiments, continuous metal grains may form between the conductive layer 9 and the conductive layer 9A above after the stabilization step because there is no intervening barrier layer 7 between the respective conductive layers. The planarized upper surface 13A of the interconnect structure 10 can be processed further for forming additional interconnect layers or for bonding (e.g., direct bonding) to other structures or elements.

Figure 4:
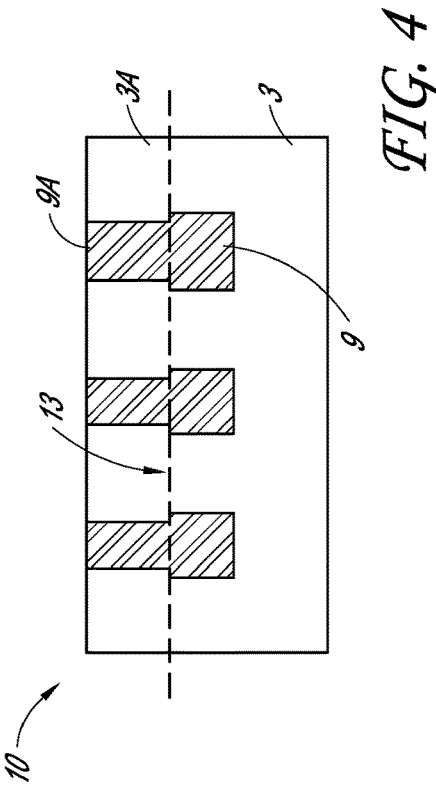
FIG. 4 is a schematic side sectional view of an interconnect structure, according to another embodiment.

FIG. 4 is a schematic side sectional view of an interconnect structure 10, according to another embodiment. Unless otherwise noted, components shown in FIG. 4 are the same as or generally similar to like-numbered components of FIGS. 3A-3I. For example, the interconnect structure 10 of FIG. 4 can be formed in the same manner as the interconnect structure 10 shown in FIGS. 3A-3D. However, unlike the embodiment of FIG. 3E, instead of applying the protective layer 11 of FIG. 3E over the non-conductive and conductive materials 3, 9, in FIG. 4, no protective layer is provided. Rather, in the embodiment of FIG. 4, after stabilization and planarization (see FIG. 3D), the upper surface 13 of the non-conductive and conductive materials 3, 9 can be exposed to a surface-treating species (e.g., nitrogen). As explained above, the surface-treating species N can be supplied by a suitable plasma process (e.g., a nitrogen-containing plasma). The resulting nitridized surface 13 of the non-conductive material 3 can provide improved adhesion to the second non-conductive material 3A, without using the protective layer 11 of FIG. 3E. Eliminating the protective layer 11 of FIG. 3E can advantageously reduce manufacturing costs and simplify processing, while maintaining sufficient adhesion between the non-conductive materials 3, 3A.

FIGS. 5A-5C illustrate side sectional views of elements 1 comprising interconnect structures 10 according to various embodiments disclosed herein. FIG. 5A is a schematic side sectional view of an interconnect structure 10. Unless otherwise noted, components of FIG. 5A are the same as or generally similar to like numbered components of FIGS. 3A-4. The interface structure 10 of FIG. 5A can comprise a non-conductive material 3 and a conductive material 9 directly deposited over surface-treated sidewalls 14 and bottom surfaces 15 of the cavities. As explained above, in various embodiments, the sidewalls 14 and bottom surfaces 15 can be exposed to a plasma, e.g., a nitrogen-based plasma. The surface treating species N can chemically react with the non-conductive material to form a compound of the non-conductive material (e.g., a silicon oxide based material) with the surface treating species N (e.g., nitrogen). The surface-treated species N can treat the surfaces 14, 15 so as to improve adhesion of the conductive material 9 (including a seed layer) to the non-conductive material 3, without using a separate barrier layer on the sidewalls 14 and bottom surfaces 15 of the cavities. Thus, in the embodiment of FIG. 5, there is no barrier layer on either the bottom surfaces 15 of the cavities or on the sidewalls 14 of the cavities.

Figure 6:
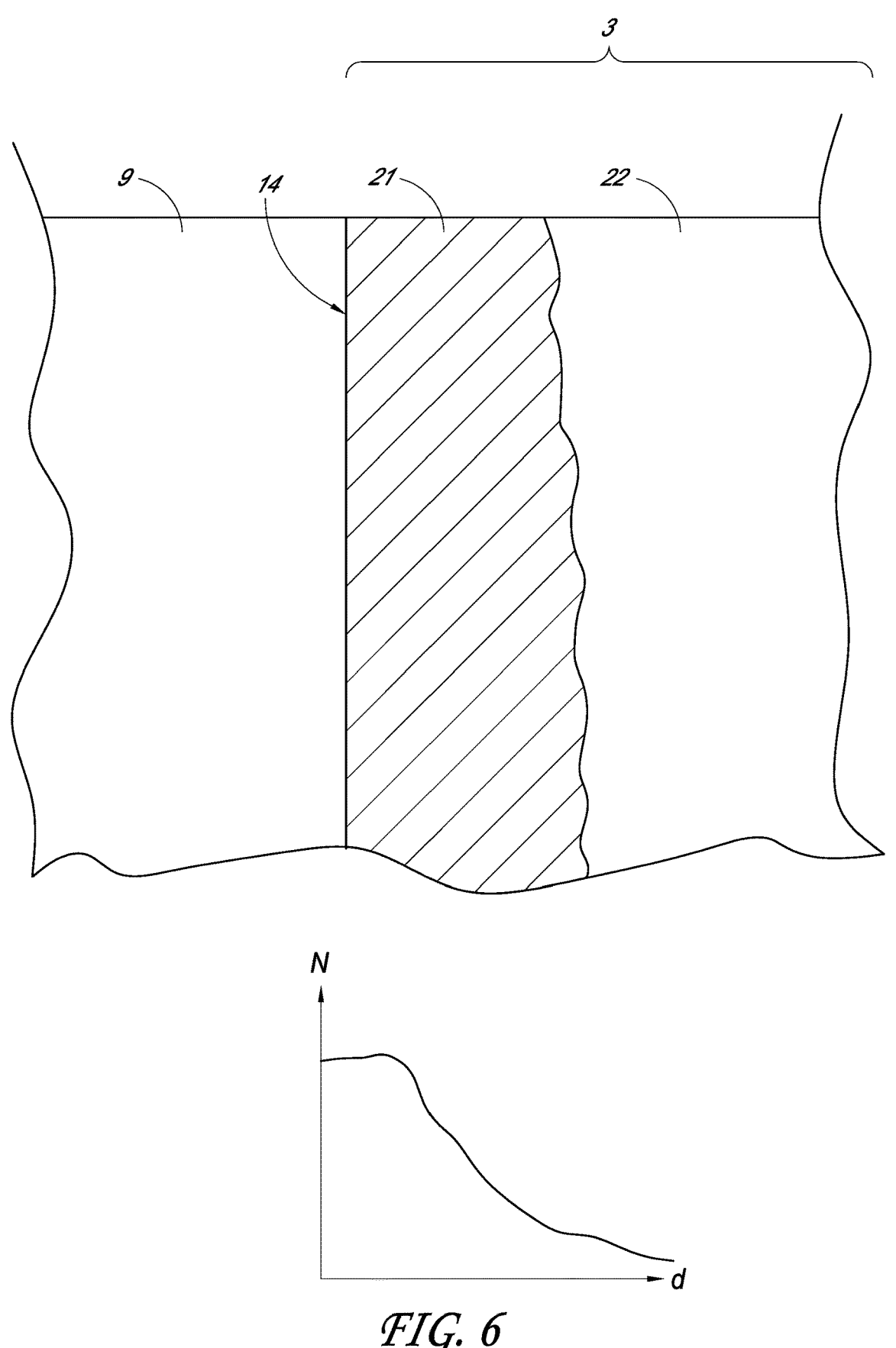
FIG. 6 is a schematic, enlarged side sectional view of an interface region of the non-conductive material.

As shown in FIGS. 5A and 6, the patterned non-conductive material can comprise a primary region 22 and an interface region 21. The interface region 21 can be between the conductive material and the primary region. For example, in FIG. 6, the primary region 22 can comprise the bulk non-conductive material that defines the majority of the non-conductive material 3. In embodiments that utilize a silicon oxide based material for the non-conductive material 3, the primary region 22 can comprise silicon oxide (and may include other compounds as well). As explained above, the exposed surfaces (e.g., surfaces 14, 15) of the non-conducting material 3 can be exposed to a surface-treating species N (such as a nitrogen plasma). Exposure of the surfaces 14, 15 to the surface-treating species N causes the species N to chemically react with the non-conductive material 3 through a depth d of the non-conductive material 3. The surface-treating species N can blend or diffuse into the non-conductive material 3. Accordingly, the profile of species N content against the depth d into the non-conductive material 3 is characteristic of diffusion from plasma treatment with species N, which also applies to other embodiments described herein. As is known to the skilled artisan, diffusion profiles fall off fairly quickly for back-end of line processing, where the substrate is not subjected to extended high temperature processing, as compared to diffusion profiles in integrated circuits for materials closer to the bulk semiconductor surface.

The conductive material 9 may not extend into the interface region 21. As shown in FIG. 6, for example, the surface-treating species N (which may include nitrogen) can vary across the depth of the interface region 21. For example, at the boundary with the conductive material 9, the interface region 21 can have a maximum amount of the surface-treating species N. The amount of the surface-treating species can decrease with increasing depth d into the non-conductive material 3. The depth d may be less than 3 nm and can be significantly smaller than the thickness of the primary region 22 (e.g., dielectric layer). For example, the thickness of the primary region 22 may vary, for example, between 500 nm to over 50,000 nm. Thus, for a nitrogen-containing treatment, the interface region 21 can be nitridized relatively uniformly across the surfaces 14, 15 of the cavities, with the amount of nitrogen in the interface region 21 decreasing with increasing depth d into the non-conductive material 3. In various embodiments that use nitrogen as the nitrogen-containing species N, other species (such as carbon or boron) may also be present with nitrogen in the interface region 21. Furthermore, although FIG. 6 illustrates an interface region 21 along a sidewall of the cavity 6, it should be appreciated that the profile of FIG. 6 can be provided on any surface treated with the surface-treating species N, including on the floors of the cavities 6, on horizontal or external surfaces of the non-conductive material 3, etc. In various embodiments, a depth d of the interface region can be less than 10 nm, less than 5 nm, less than 3 nm, or less than 2 nm. It should be appreciated that FIG. 6 illustrates one example profile of how the surface-treating species N can vary with depth d. In other embodiments, for example, the depth d can vary approximately linearly with depth d. In other arrangements, the amount of the surface-treating species N can vary more slowly with depth d than what is illustrated in FIG. 6. Further, the surface-treating species N can diffuse into the bulk primary region 22 such that the interface between the primary region 22 and the interface region 21 may be uneven or more diffuse.

FIG. 5B is a schematic side sectional view of an interconnect structure 10 according to various embodiments. Unless otherwise noted, components of FIG. 5B are the same as or generally similar to like numbered components of FIGS. 3A-5A. As shown in FIG. 5B, the interconnect structure 10 can comprise multiple (e.g., two) layers. In FIG. 5B, the lower layer of non-conductive material 3 can comprise a barrier layer 7 lining the surfaces 14, 15 of the cavities. In the arrangement of FIG. 5B, the conductive material 9 can be deposited over the barrier layer 7. However, the upper layer of non-conductive material 3A may not include the barrier layer. Rather, as explained above, the surfaces 14A, 15A of the cavities can be exposed to the surface-treating species N (e.g., nitrogen), and the conductive material 9A can be deposited directly over the treated surfaces 14A, 15A without providing an intervening barrier layer. Further, as shown in FIG. 5B, the protective layer 11 can be provided between the layers of non-conductive material 3, 3A.

FIG. 5C is a schematic side sectional view of an interconnect structure 10 according to various embodiments. Unless otherwise noted, components of FIG. 5C are the same as or generally similar to like numbered components of FIGS. 3A-5B. FIG. 5C is generally similar to the embodiment of FIG. 5D, except in FIG. 5C, the interconnect structure 10 does not include the intervening protective layer 11 shown in FIG. 5B. Rather the upper surface 13 of the non-conductive material 3 may be exposed to the surface-treating species N, which can improve adhesion of the non-conductive materials 3, 3A, without using the intervening protective layer (such as the protective layer 7). In some embodiments, the conductive layer 9 in the lower non-conductive layer 3 may be different or dissimilar from the conductive layer 9A in the non-conductive layer 3A above. For example, the conductive layer 9 may comprise tungsten or a tungsten alloy, and the conductive layer 9A may comprise copper or a copper alloy.

FIGS. 5D-5F illustrate side sectional views of bonded structures 5 comprising bonded elements 1, 1' bonded to one another, according to various embodiments. FIG. 5D is a schematic side sectional view of first and second elements 1, 1' directly bonded to each other without an intervening adhesive. Each element 1, 1' can comprise an interconnect structure 10 similar to the one shown in FIG. 5A. As explained above, the elements 1, 1' can be prepared for direct bonding, and corresponding non-conductive materials 3, 3A can be directly bonded to one another without an intervening adhesive. The conductive materials 9, 9A can also be directly bonded to one another without an intervening adhesive.

Similarly, FIGS. 5E-5F are schematic side sectional views of first and second elements 1, 1' directly bonded to one another. In FIG. 5E, the interconnect structure 10 of the first element 1 can be similar to the interface structure 10 of FIG. 5C, and the interconnect structure 10 of the second element 1' can be similar to the interconnect structure 10 of FIG. 5A. In FIG. 5F, the interconnect structure 10 of the first element 1 can be similar to the interconnect structure 10 of FIG. 5B, and the interconnect structure 10 of the second element 1' can be similar to the interconnect structure 10 of FIG. 5A. Still other combinations of bonded elements are possible. Although the elements 1, 1' of FIGS. 5D-5F are shown as being directly bonded to one another, in other embodiments, the elements 1, 1' can be adhered to one another in other ways, including by way of an intervening adhesive.

As explained above, in various embodiments, the surface of the non-conductive material may be treated with the surface-treating species N prior to coating with the conductive material 9. As explained above, in some embodiments, the non-conductive material 3 may be patterned with cavities 6 and the conductive material 9 can be provided in the patterned cavities 6. For example, as illustrated in FIGS. 3A-4, the cavities 6 may comprise blind holes or trenches. In other embodiments, however, the cavities 6 may comprise through-holes or vias, e.g., for the formation of through-silicon vias or TSVs (or other types of through substrate electrical connections).

In still other arrangements, the non-conductive material 3 may not be patterned (or may not be patterned to define cavities) before treating the surfaces and depositing the conductive material 9. FIGS. 7A-7G illustrate processing steps in which the non-conductive material 3 may not be patterned with cavities prior to the surface treatment. FIG. 7A is a schematic side sectional view of an interconnect structure 10 in which the upper surface 13 of the non-conductive material 3 is exposed to a surface-treating species N without patterning cavities in the non-conductive material, according to various embodiments. For example, unlike in FIG. 3A, the non-conductive material 3 may be exposed to a plasma comprising the surface-treating species N, which can comprise nitrogen or another suitable species, as explained above. In various embodiments, the surface-treating species N (e.g., a nitrogen-containing species) can be applied over a silicon oxide layer of the non-conductive material 3 as explained above. The surface-treating species N can improve adhesion of the subsequently applied conductive material 9 to the non-conductive material 3.

FIG. 7B is a side sectional view of the interconnect structure 10 after depositing the conductive material 9 over the treated surface 13 of the non-conductive material 3. The conductive material 9 can comprise any suitable type of conductor, such as copper, nickel aluminum, titanium. As explained above, the conductive material 9 can be deposited in any suitable manner, including, e.g., by sputtering using a plasma source, by atomic layer deposition (ALD), by chemical vapor deposition (CVD), electroplating or electroless deposition etc. In the illustrated embodiment, the conductive material 9 can be blanket-deposited over the non-conductive material 3.

FIG. 7C is a schematic side sectional view of the interconnect structure 10 after patterning the conductive material 9. In the illustrated embodiment, the conductive material 9 can be patterned with cavities 6 or trenches in any suitable way. For example, in some embodiments, the conductive material 9 can be masked and etched to define the patterned cavities 6. Further, as shown in FIG. 7C, the conductive material 9 and the exposed non-conductive material 3 at the floor of the cavities 6 can be exposed to another surface treatment with the surface-treating species N, such as a plasma treatment. As explained above, the surface-treating species N can comprise nitrogen in various embodiments.

FIG. 7D is a schematic side sectional view of the interconnect structure 10 after depositing another layer of non-conductive material 3A over the conductive material 9 and in the cavities 6 over the exposed portions of the non-conductive material 3. As shown in FIG. 7D, the non-conductive material 3A can be deposited over both the conductive material 9 and the non-conductive material 3. The non-conductive material 3A can be deposited in any suitable manner, including, e.g., ALD, CVD, spin coating, etc. The surface treatment of FIG. 7C can improve the adhesion of the non-conductive material 3A to the exposed surfaces of the conductive material 9 and/or the non-conductive material 3. In one embodiment, portions of the coated non-conductive material 3A may be removed by etching methods or by planarization methods.

FIG. 7E is a schematic side sectional view of the interconnect structure 10 after exposing the conductive material 9 underlying the additional non-conductive material 3A. In various embodiments, for example, the interconnect structure 10 can be masked and the portions of the non-conductive material 3A that overly the conductive material 9 can be removed, e.g., by etching. After the removal, portions 19 of the non-conductive material 3A may extend above the upper surface of the conductive material 9. Further, as shown in FIG. 7E, the exposed surfaces of the non-conductive material 3A and the conductive material 9 can be exposed to another surface treatment with the surface-treating species N, which can comprise a plasma treatment. As explained above, the surface-treating species N can comprise nitrogen.

FIG. 7F is a schematic side sectional view of the interconnect structure 10 after depositing an additional conductive material 9A over the treated, exposed surfaces of the non-conductive material 3A and the conductive material 9. The conductive material 9A can be conformally deposited using any suitable technique, as explained above. Portions of the conductive material 9A can be provided between the portions 19 of the non-conductive material 3A over the conductive material 9, as well as over the exposed upper surfaces of the non-conductive material 3A.

FIG. 7G is a schematic side sectional view of the interconnect structure 10 after planarizing portions of the additional conductive material 9A and the additional non-conductive material 3A. As shown in FIG. 7G, the interconnect structure 10 can be planarized such that the conductive material 9A is generally planar relative to the upper surface of the non-conductive material 3A. Any suitable type of planarization process can be used, including, e.g., CMP. In some embodiments, one or more widths of the conductive layer 9A may be larger than that of conductive layer 9, e.g., by more than 10% or vice versa. Similarly, the depth of conductive layer 9 may be different from that of conductive layer 9A. In other embodiments, the conductive layer 9 or conductive layer 9A may comprise one or more conductors. For example, conductor 9 may comprise a first layer nickel and a second layer of gold. In other embodiments, the conductor 9A may comprise a first layer of copper and a second layer of indium or solder.

It should be appreciated that there may be other ways to form structures similar to those shown in FIGS. 7A-7G, e.g., interconnect structures 10 in which cavities are not formed on the non-conductive material 3 prior to surface treatment. For example, in various embodiments, instead of exposing the conductive material 9 as shown in FIG. 7E, the structure of FIG. 7D can be planarized, and additional layers may be built onto the planarized structure. Still other methods may be suitable. The conductive material 9 may be further processed by patterning to form additional conductive structures. Multi-layer conductive structures may be formed and a formed structure formed by this method or methods may be attached to other devices or packages with other conductive materials, for example, by direct bonding methods, or the use of flowable metallurgies such as solder, conductive particulates and nanoparticles, wirebonds, etc.

In some embodiments, after bonding two elements 1, 1' (such as in the arrangements shown in FIGS. 5D-5F), the supporting substrate (not shown) may be removed and portions of the dielectric layer (e.g., non-conductive material 3) may be removed to expose portions of the conductive layer 9 at the floor of the cavities 6 without the intervening barrier layer 7. For example, the back sides of the bulk substrates can be removed to expose the conductive material 9 at the floors of the cavities 6. In such an arrangement, therefore, after bonding and removing the bulk substrate, the exposed conductive material 9 and the surrounding non-conductive material 3 can be used as an interposer and/or for bonding to other elements or structures.

In some embodiments, as explained above, the processed structures of FIGS. 3A-5F may be processed further by other method before attaching to other devices or package structures. For example, the elements 1 described above can be processed to include other conductive materials, for example, flowable metallurgies, such as solder, conductive particulates and nanoparticles, wirebonds, and combinations thereof. As explained above, in some embodiments, the processed elements 1 with interconnect structures 10 may be used alone or in combination with only packaging structures (e.g., package substrates). In other embodiments, the elements 1 shown herein can be bonded to other structures with a conductive adhesive, e.g., solder. In other embodiments, as explained above, the elements 1 can be directly bonded to other structures without an intervening adhesive.

In some embodiments, the elements 1 of FIGS. 3A-5F may be used to form high performance vertical or horizontal capacitors. In one example, in FIG. 3, the dielectric layer or non-conductive material 3 adjacent to the cavity 6 may comprise a high aspect ratio dielectric layer after the dielectric removal step (e.g., after forming the cavity 6). In some applications, the aspect ratio of the dielectric plates, columns, rings, or posts may vary between 5 to 100. After cleaning the patterned dielectric layer, the surface of the dielectric layer can be treated with the surface-treating species (e.g., by nitrogen plasma methods), and adjacent cavities 6 can be filled with the conductive material 9 as shown in FIG. 3C to form one or a plurality of capacitors between adjacent metal-filled cavities. Depending on the aspect ratio of the cavity 6 adjacent to the high aspect ratio dielectric layer, the cavity may be coated by atomic layer deposition (ALD), plasma enhanced atomic layer deposition (PEALD), electroless, electrolytic, CVD, and combinations thereof. In subsequent steps, the unwanted portion of the conductive layer 6 can be removed by chemical mechanical polishing (CMP) or other etching methods, including wet etching. One or more wiring layers may be formed over the capacitor to connect to the various capacitor electrodes (e.g., adjacent metal-filled cavities 6. In some applications, the width of the metal cavity 6 can be wider than the width of the dielectric layer by more than 3 times. As an example, the width of the non-conductive material adjacent the metal-filled cavities 6 (e.g., between adjacent metal-filled cavities 6) may be 50 nm and the width of the conductive layer 9 in the cavities 6 may be 150 nm or more. The absence of the intervening resistive barrier layer (such as barrier layer 7), which may have typical resistivity between 50 to 1000 micro ohm-cm) can reduce the series resistance (or equivalent series resistance) of the capacitor and improve the overall capacitance in embodiments that define capacitor structures in the element 1. In some embodiments, a capacitor can be formed at an interface between the conductive materials 9, 9*a*, e.g., at the conductive interface region 16. For example, in some embodiments, an insulating material (e.g., oxide) can be provided (e.g., deposited) between the conductors 9, 9*a* (e.g., copper). Similarly, the methods and structures disclosed herein may be used in conjunction with other passive electrical and non-electrical device, including magnetic devices, optical devices, cooling devices, etc.

Figure 8:
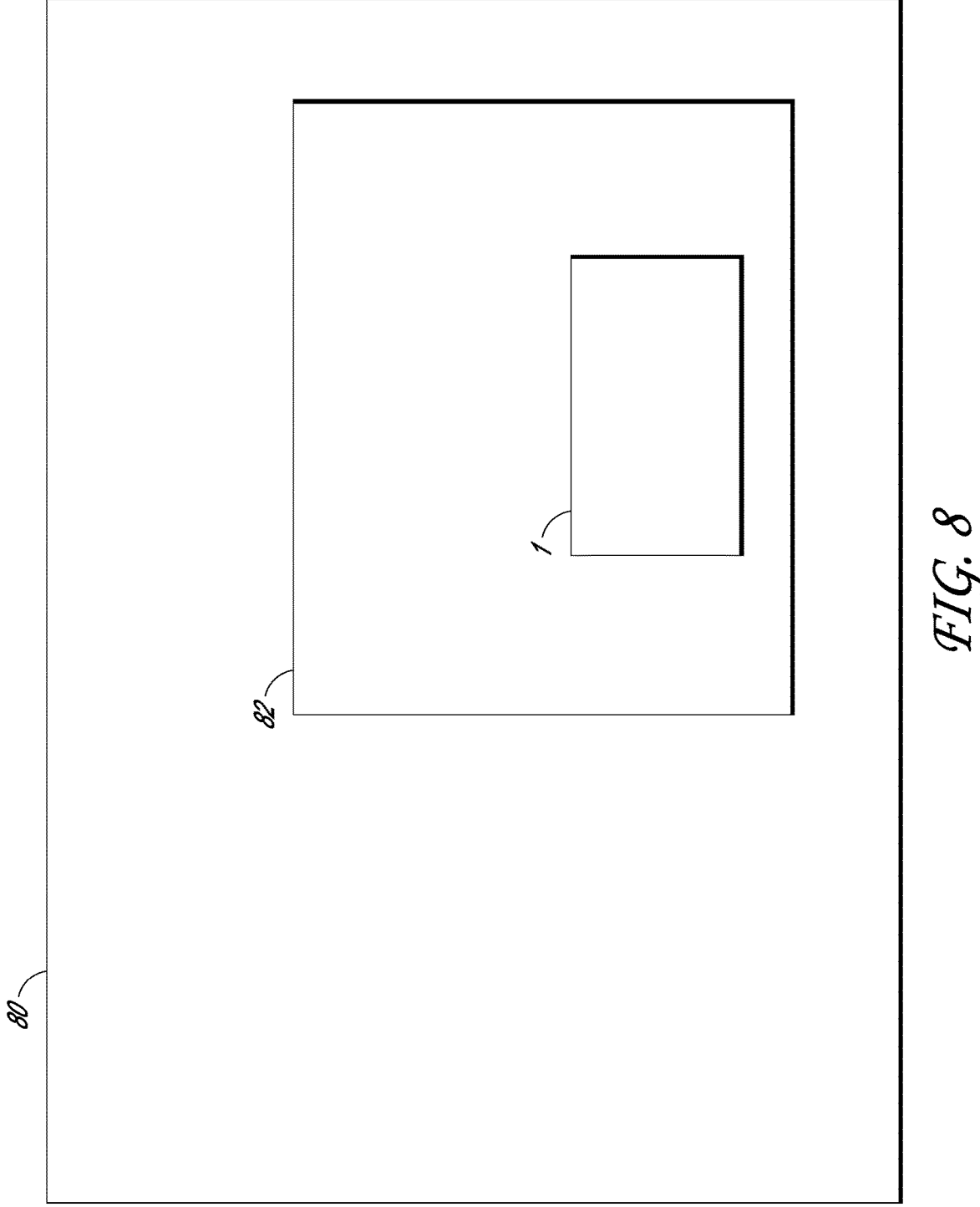
FIG. 8 is a schematic system diagram of an electronic system incorporating one or more elements, according to various embodiments.

FIG. 8 is a schematic system diagram of an electronic system 80 incorporating one or more elements 1, according to various embodiments. The one or more elements 1 may comprise one or more bonded structures 5 (e.g., bonded elements 1, 1') as explained above in various embodiments. In other embodiments, the elements 1 may not be bonded to other structures. The system 80 can comprise any suitable type of electronic device, such as a mobile electronic device (e.g., a smartphone, a tablet computing device, a laptop computer, etc.), a desktop computer, an automobile or components thereof, a stereo system, a medical device, a camera, or any other suitable type of system. In some embodiments, the electronic system 80 can comprise a microprocessor, a graphics processor, an electronic recording device, or digital memory. The system 80 can include one or more device packages 82 which are mechanically and electrically connected to the system 80, e.g., by way of one or more motherboards. Each package 82 can comprise one or more elements 1. The system 80 shown in FIG. 8 can comprise any of the elements 1 shown and described herein.

In one embodiment, a method for forming an interconnect structure in an element is disclosed. The method can include providing a non-conductive material having a cavity. The method can include exposing a surface of the cavity in the non-conductive material to a surface nitriding treatment. The method can include depositing a conductive material onto the treated surface after the exposing.

In another embodiment, an element comprising an interconnect structure is disclosed. The interconnect structure can comprise a non-conductive material comprising a primary region and an interface region. A conductive material can be provided directly over the non-conductive material with the interface region between the conductive material and the primary region. The non-conductive material of the interface region can be nitridized.

In another embodiment, a method for forming an interconnect structure in an element is disclosed. The method can include patterning a cavity in a non-conductive material. The method can include exposing a surface of the cavity in the non-conductive material to a plasma comprising a surface-treating species. The method can include depositing a conductive material directly onto the treated surface after the exposing.

In another embodiment, a method for forming an interconnect structure in an element is disclosed. The method can comprise exposing a surface of a non-conductive material to a plasma comprising a surface-treating species. The method can comprise contacting a conductive material directly with the treated surface after the exposing.

In another embodiment, a method for forming an interconnect structure in an element is disclosed. The method can comprise forming a layer comprising a non-conductive material and a conductive material. The method can comprise exposing a surface of the layer to a plasma comprising a surface-treating species. The method can comprise forming another layer comprising an additional conductive material directly onto the treated surface after the exposing.

In another embodiment, a method for forming an interconnect structure in an element is disclosed. The method can comprise providing a layer comprising a non-conductive material with one or more cavities defined therein. The method can comprise exposing a surface of the layer to a plasma comprising a surface-treating species. The method can comprise forming a conductive material in the one or more cavities in the layer without an intervening conductive barrier layer.

In another embodiment, a structure is disclosed. The structure can comprise a non-conductive material having one or more cavities with a nitrided surface, and a conductive material in direct contact with the nitrided surface of the non-conductive material.

In another embodiment, a method for forming an interconnect structure in an element is disclosed. The method can comprise forming one or more cavities by patterning a non-conductive material. The method can include exposing one or more surfaces of the patterned non-conductive material to a plasma comprising a surface-treating species. The method can include forming a conductive material over the treated surfaces of the patterned non-conductive material. The method can include forming a planar surface by removing the portions of the conductive and non-conductive materials.

In another embodiment, a structure is disclosed. The structure can include a patterned non-conductive material with one or more cavities. The structure can include patterned surfaces comprising a nitrided surface. A conductive material can be in direct contact with the nitrided surface of the non-conductive material.

In some applications, the structure can include a patterned non-conductive material with one or more cavities. The structure can include patterned surfaces comprising a nitrided surface. A conductive material can be in direct contact with the nitrided surface of the non-conductive material and the conductive material fills at least 50% of the depth of cavities in the non-conductive material.

For purposes of summarizing the disclosed embodiments and the advantages achieved over the prior art, certain objects and advantages have been described herein. Of course, it is to be understood that not necessarily all such objects or advantages may be achieved in accordance with any particular embodiment. Thus, for example, those skilled in the art will recognize that the disclosed implementations may be embodied or carried out in a manner that achieves or optimizes one advantage or group of advantages as taught or suggested herein without necessarily achieving other objects or advantages as may be taught or suggested herein.

All of these embodiments are intended to be within the scope of this disclosure. These and other embodiments will become readily apparent to those skilled in the art from the following detailed description of the embodiments having reference to the attached figures, the claims not being limited to any particular embodiment(s) disclosed. Although this certain embodiments and examples have been disclosed herein, it will be understood by those skilled in the art that the disclosed implementations extend beyond the specifically disclosed embodiments to other alternative embodiments and/or uses and obvious modifications and equivalents thereof. In addition, while several variations have been shown and described in detail, other modifications will be readily apparent to those of skill in the art based upon this disclosure. It is also contemplated that various combinations or sub-combinations of the specific features and aspects of the embodiments may be made and still fall within the scope. It should be understood that various features and aspects of the disclosed embodiments can be combined with, or substituted for, one another in order to form varying modes of the disclosed implementations. Thus, it is intended that the scope of the subject matter herein disclosed should not be limited by the particular disclosed embodiments described above, but should be determined only by a fair reading of the claims that follow.

What is claimed is:

1. An element comprising an interconnect structure, the interconnect structure comprising:
   a non-conductive semiconductor material comprising a primary region and an interface region;
   a conductive material provided directly over the non-conductive semiconductor material with the interface region between the conductive material and the primary region;
   wherein of the non-conductive semiconductor material only the non-conductive semiconductor material of the interface region is nitridized; and
   wherein an amount of nitrogen varies through a depth of the interface region between the primary region and the conductive material.

2. The element of claim 1, wherein the non-conductive semiconductor material comprises a silicon based material.

3. The element of claim 2, wherein the conductive material comprises copper.

4. The element of claim 2, wherein the interface region comprises silicon and nitrogen.

5. The element of claim 1, wherein the amount of nitrogen is maximized at a boundary with the conductive material.

6. The element of claim 1, wherein the non-conductive semiconductor material is patterned with one or more sidewalls that define one or more cavities, the interface region disposed along the sidewalls of the one or more cavities.

7. The element of claim 1, wherein no barrier layer is disposed between the non-conductive semiconductor material and the conductive material.

8. The element of claim 1, wherein a width of the interface region is less than 10 nm.

9. The element of claim 8, wherein the width of the interface region is less than 5 nm.

10. A method for forming an interconnect structure in an element, the method comprising:
   forming one or more cavities by patterning a non-conductive semiconductor material;

exposing one or more surfaces of the patterned non-conductive semiconductor material to a plasma comprising a surface-treating species;
   forming a conductive material at least partially filling the treated surfaces of the patterned non-conductive semiconductor material; and
   forming a planar surface by removing portions of the conductive and non-conductive semiconductor materials.

11. The method of claim 10, comprising exposing the one or more surfaces of the patterned non-conductive semiconductor material to a nitrogen-containing plasma.

12. The method of claim 10, comprising forming the conductive material over the treated surfaces without an intervening conductive barrier layer between the conductive material and the non-conductive semiconductor material.

13. The method of claim 10, wherein the conductive material has a resistivity in a range of 1.5 micro ohm-cm to 50 micro ohm-cm.

14. The method of claim 10, wherein the conductive material fills at least 50% of depth of the one or more cavities.

15. A method for forming an interconnect structure in an element, the method comprising:
   providing a non-conductive semiconductor material having a cavity;
   exposing a surface of the cavity in the non-conductive semiconductor material to a surface nitriding treatment;
   depositing a conductive material onto the treated surface after the exposing;
   planarizing the conductive material to remove unwanted materials including portions of the non-conductive semiconductor material;
   providing a protective layer over the planarized conductive material and non-conductive semiconductor material; and
   removing a portion of the protective layer that is disposed over the planarized conductive material.

16. The method of claim 15, wherein:
   the surface nitriding treatment is a first surface nitriding treatment, and
   the method further comprises:
      providing a second non-conductive semiconductor material over the non-conductive semiconductor material and the conductive material;
      patterning a second cavity in the second non-conductive semiconductor material;
      exposing a second surface of the second cavity in the second non-conductive semiconductor material to a second surface nitriding treatment; and
      depositing a second conductive material onto the second treated surface after the exposing the second surface.

17. The method of claim 16, further comprising:
   exposing an upper surface of the non-conductive semiconductor material to an intervening nitriding treatment before providing the second non-conductive semiconductor material; and
   providing the second non-conductive semiconductor material on the treated upper surface.

18. The method of claim 15, further comprising patterning the non-conductive semiconductor material prior to exposure to the surface nitriding treatment.

19. The method of claim 15, wherein the non-conductive semiconductor material comprises a silicon based material.

20. The method of claim 15, further comprising, before exposing the surface to the surface nitriding treatment, treating the surface with one or more of carbon (C), boron (B), cobalt (Co), and manganese (Mn).

21. An element comprising an interconnect structure, the interconnect structure comprising:

a semiconductor material comprising a primary region and an interface region, wherein the semiconductor material is silicon;

a conductive material provided directly over the semiconductor material with the interface region between the conductive material and the primary region;

wherein of the semiconductor material only the semiconductor material of the interface region is nitridized; and wherein an amount of nitrogen varies through a depth of the interface region between the primary region and the conductive material.

* * * * *